United States Patent
Satoh

(10) Patent No.: US 11,043,941 B2
(45) Date of Patent: Jun. 22, 2021

(54) APPARATUSES AND METHODS FOR ADJUSTING A PHASE MIXER CIRCUIT

(71) Applicant: MICRON TECHNOLOGY, INC., Boise, ID (US)

(72) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 481 days.

(21) Appl. No.: 15/923,860

(22) Filed: Mar. 16, 2018

(65) Prior Publication Data

US 2019/0288674 A1 Sep. 19, 2019

(51) Int. Cl.
| | |
|---|---|
| H03K 5/135 | (2006.01) |
| G11C 19/28 | (2006.01) |
| H03K 5/00 | (2006.01) |

(52) U.S. Cl.
CPC ............. *H03K 5/135* (2013.01); *G11C 19/28* (2013.01); *H03K 2005/00019* (2013.01); *H03K 2005/00241* (2013.01); *H03K 2005/00286* (2013.01)

(58) Field of Classification Search
CPC ......... H03K 5/135; H03K 2005/00019; H03K 2005/00241; H03K 2005/00286; G11C 19/28
See application file for complete search history.

(56) References Cited

U.S. PATENT DOCUMENTS

| | | | |
|---|---|---|---|
| 8,525,563 B2 * | 9/2013 | Uemura | ............... H03L 7/0818 327/156 |
| 2008/0265967 A1 | 10/2008 | Goller | |
| 2009/0179676 A1 | 7/2009 | Gomm et al. | |
| 2010/0060335 A1 | 3/2010 | Kwak | |
| 2011/0267118 A1 | 11/2011 | Shin | |
| 2015/0102844 A1 | 4/2015 | Ma | |

OTHER PUBLICATIONS

International Search Report and Written Opinion for Application No. PCT/US2019/019793 dated Jun. 12, 2019, 11 pages.

* cited by examiner

*Primary Examiner* — Patrick O'Neill
(74) *Attorney, Agent, or Firm* — Dorsey & Whitney LLP

(57) ABSTRACT

Apparatuses and methods for adjusting a phase mixer circuit are disclosed. An example apparatus includes a shift register that includes a plurality of registers coupled in series to one another. The plurality of registers are grouped into a first group of registers and a second group of registers. The first group of registers includes first and second registers. The second group of registers includes a third register. The first and second registers of the first group of registers are configured to receive in common an output of the third register of the second group of registers so that both the first and second registers store the output of the third register responsive to a shift clock.

20 Claims, 21 Drawing Sheets

APPARATUSES AND METHODS FOR ADJUSTING A PHASE MIXER CIRCUIT

BACKGROUND

Many high speed electronic systems operate with critical timing requirements that dictate a need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between significant edges of the internally generated clocks of all the components should be minimized, it is not enough to feed the external clock of the system to all the components. This is because different chips may have different manufacturing parameters, which, when taken together with additional factors such as ambient temperature, voltage, and processing variations, may lead to large differences in the phases of the respective chip generated clocks.

Synchronization can be achieved by using a timing circuit, such as a digital delay locked loop (DDLL) circuit, to detect the phase difference between clock signals of the same frequency and produce a digital signal related to the phase difference. During initialization, DDLL circuits may require a relatively large number of clock cycles to synchronize. In conjunction with a DLL circuit, an open-loop topology may be used, such as a measure-controlled delay (MCD) circuit, where a timing measurement directly controls a variable delay. MCD circuits exhibit a fast lock capability (e.g., within 1-4 clock cycles after initialization). The MCD circuit generates an initial measurement, and the DDLL takes over to maintain the lock and track variations over time.

As part of the process of obtaining a locked condition after initialization, a fine delay is adjusted after a coarse delay is initially set. The fine delay adjustment may require more time than desirable due to the manner in which the fine delay is adjusted. Therefore, it may be desirable to reduce the time for delay to be adjusted to obtain a locked condition.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
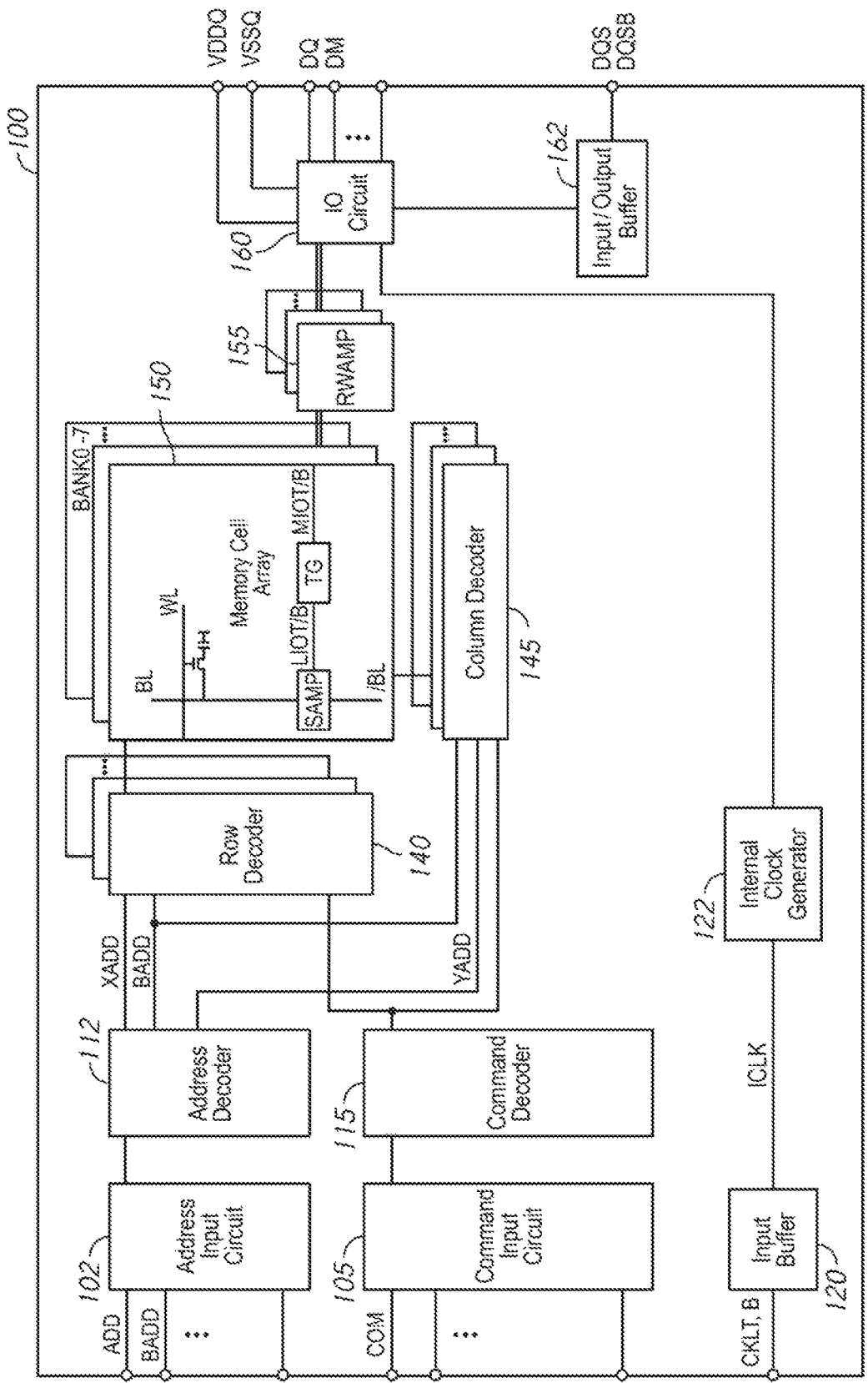
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main 110 line pair (MIOT/B), via transfer gates (TG), which function as switches.

The semiconductor device 100 may employ a plurality of external terminals that include command terminals and address terminals coupled to a command bus and an address bus to receive commands COM and addresses ADD and BADD, clock terminals to receive clocks CLKT and CLKB, strobe clock terminals to provide or receive strobe clocks DQS and DQSB, data terminals DQ and DM, and power supply terminals VDDQ and VSSQ.

The address terminals may be supplied with an address ADD and a bank address BADD, for example, from a memory controller. The address ADD and the bank address BADD supplied to the address terminals are transferred, via an address input circuit 102, to an address decoder 112. The address decoder 112 receives the address and supplies a decoded row address XADD to the row decoder 140, and a decoded column address YADD to the column decoder 145. The address decoder 112 also receives the bank address and supplies a decoded bank address BADD to the row decoder 140 the column decoder 145.

The command terminals may be supplied with command COM from, for example, a memory controller. The command may be provided as internal command signals to a command decoder 115 via the command input circuit 105. The command decoder 115 includes circuits to decode the internal command signals to generate various internal signals and commands for performing operations. For example, the command decoder 115 may provide a row command signal to select a word line and a column command signal to select a bit line.

When a read command is received and a row address and a column address are timely supplied with the read command, read data is read from a memory cell in the memory array 150 designated by the row address and column address. The read command is received by the command decoder 115, which provides internal commands to input/output circuit 160 so that read data is output to outside from the data terminals DQ via read/write amplifiers 155, and strobe clocks DQS and DQSB are provided to outside from the strobe clock terminals.

When the write command is received and a row address and a column address are timely supplied with this command, then write data is supplied to the data terminals DQ according to the DQS and DQSB strobe clocks provided to the strobe clock terminals. A data mask may be provided to the data terminals DM to mask portions of the data when written to memory. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address.

The clock terminals and data clock terminals are supplied with external clocks. The external clocks CLKT and CLKB are supplied to an input buffer 120. The CLKT and CLKB clocks are complementary. The input buffer 120 generates an internal clock ICLK based on the CLKT and CLKB clocks. The ICLK clock is provided to an internal clock generator 122.

The internal clock generator 122 provides various internal clocks based on the ICLK clock. The internal clocks may be used for timing the operation of various internal circuits. For example, the clocks may be provided to the input/output circuit 160 for timing the operation of the input/output circuit 160 to provide and receive data on the data terminals DQ. The internal clock generator 122 may also provide strobe clocks DQS and DQSB based on the ICLK clock. The DQS and DQSB clocks may be provided by the semiconductor device 100 and used by other devices to time the receipt of data DQ, for example, for a read operation. An input/output buffer 162 receives strobe clocks that are provided to the semiconductor device 100, for example, for a write operation, and provides strobe clocks, for example, for a read operation. The input/output buffer 162 provides an internal strobe clocks to the input/output circuit 160 for controlling an input timing of write data, and receives internal strobe clocks to be provided as external strobe clocks.

The power supply terminals are supplied with power supply potentials VDDQ and VSSQ. The power supply potentials VDDQ and VSSQ are supplied to the input/output circuit 160. The power supply potentials VDDQ and VSSQ are used for the input/output circuit 160 so that power supply noise generated by the input/output circuit 160 does not propagate to the other circuit blocks.

Figure 2:
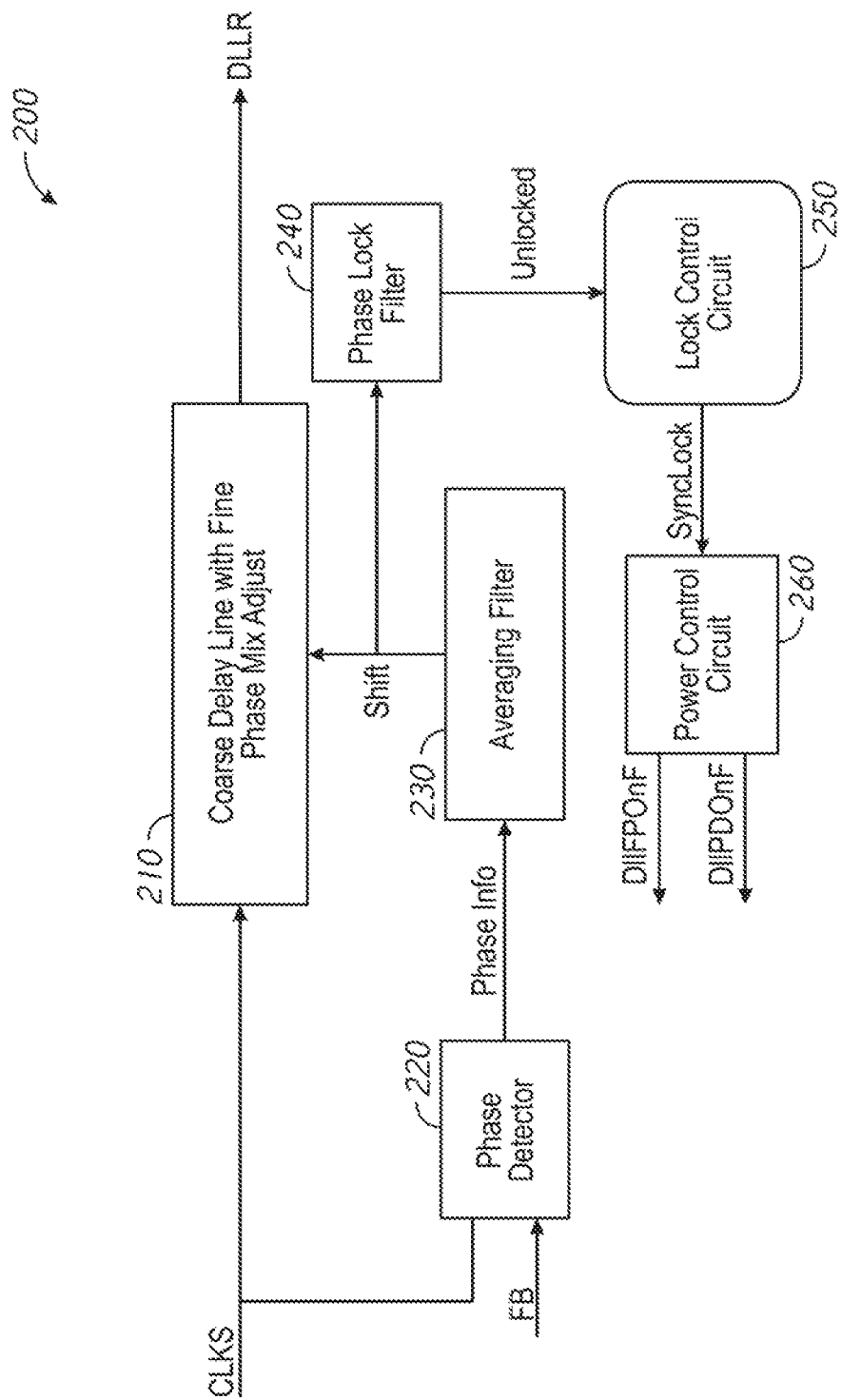
FIG. 2 is a block diagram of a clock generator circuit according to an embodiment of the disclosure.

FIG. 2 is a block diagram of a clock generator circuit 200 according to an embodiment of the disclosure. The clock generator circuit 200 may be included in the internal clock generator 122 of FIG. 1 in some embodiments of the disclosure. In such embodiments, the ICLK clock is provided to the clock generator circuit 200 as an input clock CLKS.

The clock generator circuit 200 may be a delay-locked loop (DLL) circuit. The clock generator circuit 200 includes an adjustable delay line 210 that receives the input clock CLKS and provides an output clock DLLR having a delay relative to the CLKS clock. The adjustable delay line 210 includes a coarse delay line and a fine phase adjust circuit (not shown) that provide delay to the CLKS clock. The coarse delay line may include series coupled unit delay stages that are controlled to adjust the delay by a unit delay time. For example, the a unit delay time may be added by activating a unit delay stage and removed by deactivating the unit delay stage. The fine phase adjust circuit may be controlled to provide finer clock timing adjustment (e.g., fine delay) than a unit delay stage.

The delay provided by the adjustable delay line 210 is controlled by phase information Phase Info provided by a phase detector circuit 220. The Phase Info represents a phase difference between the CLKS clock and a feedback clock FB. The FB clock is based on the DLLR clock, for example, having delay relative to the DLLR clock. The delay relative to the DLLR clock of the FB clock may be related to propagation delays of circuits through which the DLLR clock propagates (e.g., signal buffer circuits, signal lines, clock tree circuits, etc.) before being provided to a circuit that operates according to the DLLR clock. As the timing of the DLLR clock is adjusted by the adjustable delay line 210, the timing of the FB clock is also adjusted. The adjustable delay line 210 is adjusted to reduce the phase difference between the CLKS and FB clocks.

The Phase Info is provided to an averaging filter 230 which performs low pass filtering on the Phase Info. The averaging filter 230 provides the filtered Phase Info as control signals Shift to the adjustable delay line 210. By low pass filtering the Phase Info, the delay of the adjustable delay line 210 is adjusted more smoothly instead of being adjusted with every change of the Phase Info.

In operation, the adjustable delay line 210 is adjusted until the CLKS and FB clocks are in phase, as indicated by the Phase Info (represented by the Shift signal). After the CLKS and FB clocks are in phase and the Shift signal remains unchanged for a number of clock cycles, a phase lock filter 240 provides an inactive (e.g., low logic level) control signal Unlocked to a lock control circuit 250. In turn, the lock control circuit 250 provides an active (e.g., high logic level) control signal SyncLock indicating that the CLKS and FB clocks are in phase and a "locked" condition has been achieved. The SyncLock signal is provided to a power control circuit 260 that provides control signals DllFPOnF and DllPDOnF, which may be used to control the clock generator circuit 200 to enter a lower power operating condition to reduce power consumption after a locked condition is achieved.

Achieving a locked condition for the clock generator circuit 200 may be time consuming, for example, taking hundreds of clock cycles of the CLKS clock. This may especially be the case after the clock generator circuit 200 is initialized, for example, when initially powered up or reset.

Figure 3:
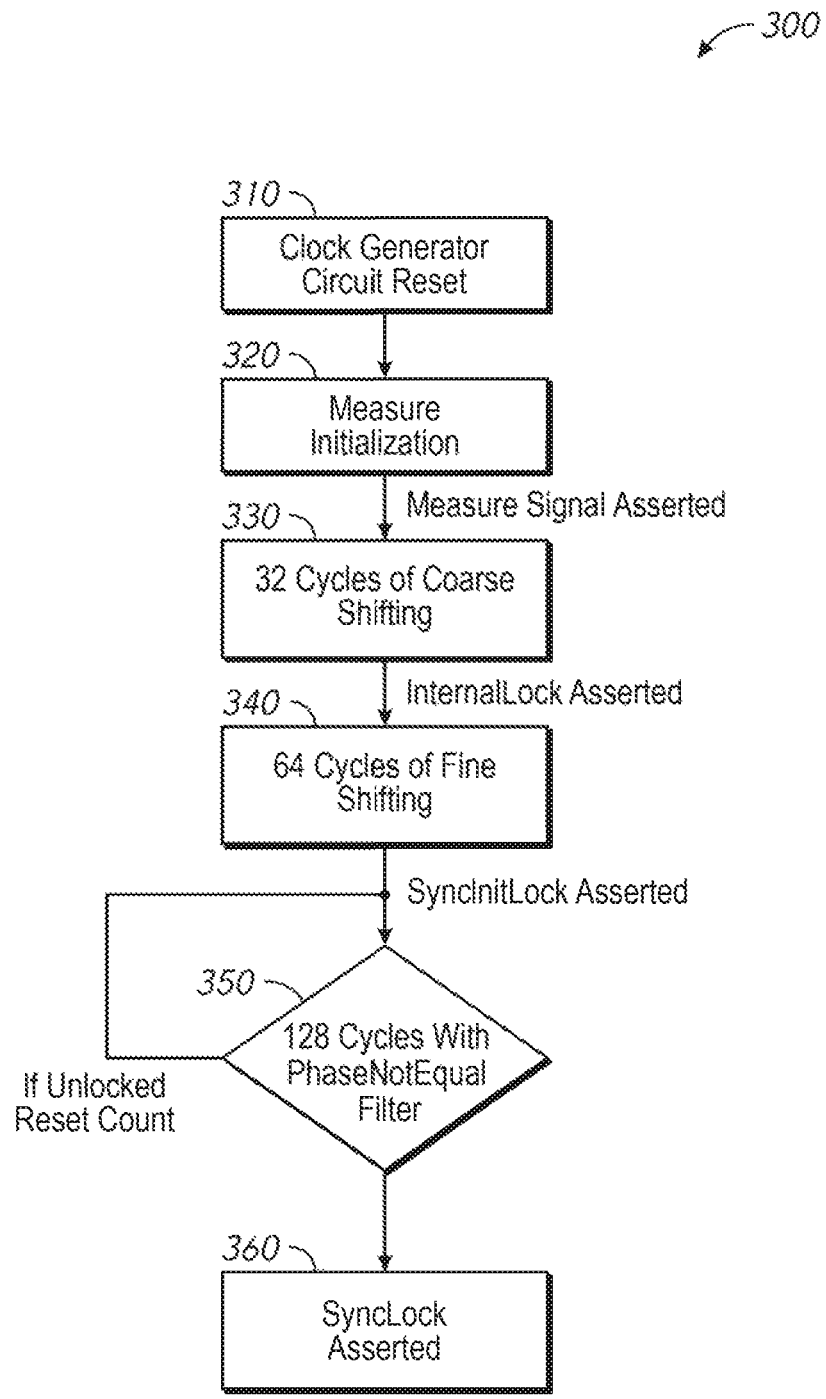
FIG. 3 is a flow diagram of a typical initialization operation for a clock generator circuit.

FIG. 3 is a flow diagram of a typical initialization operation 300 for a clock generator circuit, for example, clock generator circuit 200.

At step 310, the clock generator circuit is reset (e.g., power up, reset, etc.) to begin initialization. At step 320 a loop delay of the clock generator circuit is measured during a measure initialization operation to determine an initial delay setting, as represented by a Measure Signal. The loop delay of the clock generator circuit may be a propagation delay of the CLKS clock through the circuits of the clock generator circuit when providing the FB clock. For example, with reference to the clock generator circuit 200 of FIG. 2, the loop delay may include the propagation delay of the CLKS clock through the adjustable delay line 210 set with minimal delay, and other circuits of the clock path before returning as the FB clock to the phase detector circuit 220.

When the measure initialization operation of step 320 is completed, the Measure Signal is asserted, and a coarse delay of the adjustable delay circuit is set to an initial delay and the further adjusted over several clock cycles at step 330. Following the clock cycles of coarse delay adjustment, a control signal InternalLock is asserted to indicate completion of the coarse delay adjustment and a fine delay of the adjustable delay circuit is then adjusted over several clock cycles at step 340. Following the clock cycles of fine delay adjustment, a control signal SyncInitLock is asserted to indicate completion of the fine delay adjustment. In the embodiment shown in FIG. 3, the coarse delay is adjusted over 32 clock cycles of the CLKS clock and the fine delay is adjusted over 64 clock cycles of the CLKS clock. However, the number of clock cycles for the coarse delay adjustment and/or the fine delay adjustment may be greater or less than shown for other embodiments of the disclosure.

With the SyncInitLock signal asserted following step 340, a count is reset and a number of clock cycles are measured at step 350 to determine whether a locked condition for the clock generator circuit has been achieved. A locked condition is considered achieved when a count of clock cycles has reached a count threshold while the SyncInitLock signal is asserted. Counting of the number of clock cycles and determining whether the count threshold if reached may be performed by a filter circuit (e.g., referenced as a "Phase-NotEqual: filter circuit at step 350). Once the count threshold is reached, the SyncLock signal is asserted at step 360 to indicate a locked condition. However, if the SyncInitLock signal is deasserted before the count reaches the threshold (indicating that the fine delay was adjusted due to a phase difference between CLKS and FB clocks), the count is reset. Thus, when the count reaches the threshold, there is assurance that a locked condition has been achieved. In the embodiment shown in FIG. 3, the count threshold is 128 clock cycles before a locked condition is considered achieved. However, the number of clock cycles for the count threshold may be greater or less than shown for other embodiments of the disclosure.

The setting of the coarse delay to an initial delay as previously described with reference to FIG. 3 typically reduces the time for the clock generator circuit to achieve a locked condition, as compared to incrementally adjusting the coarse delay following reset. However, when further coarsely adjusting the initial coarse delay by a unit delay causes the PhaseInfo (and the Shift) signal to search between adding and removing the unit delay, assertion of the InternalLock signal may be delayed. That is, the unit delay of the adjustable delay circuit may be too large a step to provide equilibrium for the coarse delay adjustment.

Figure 4:
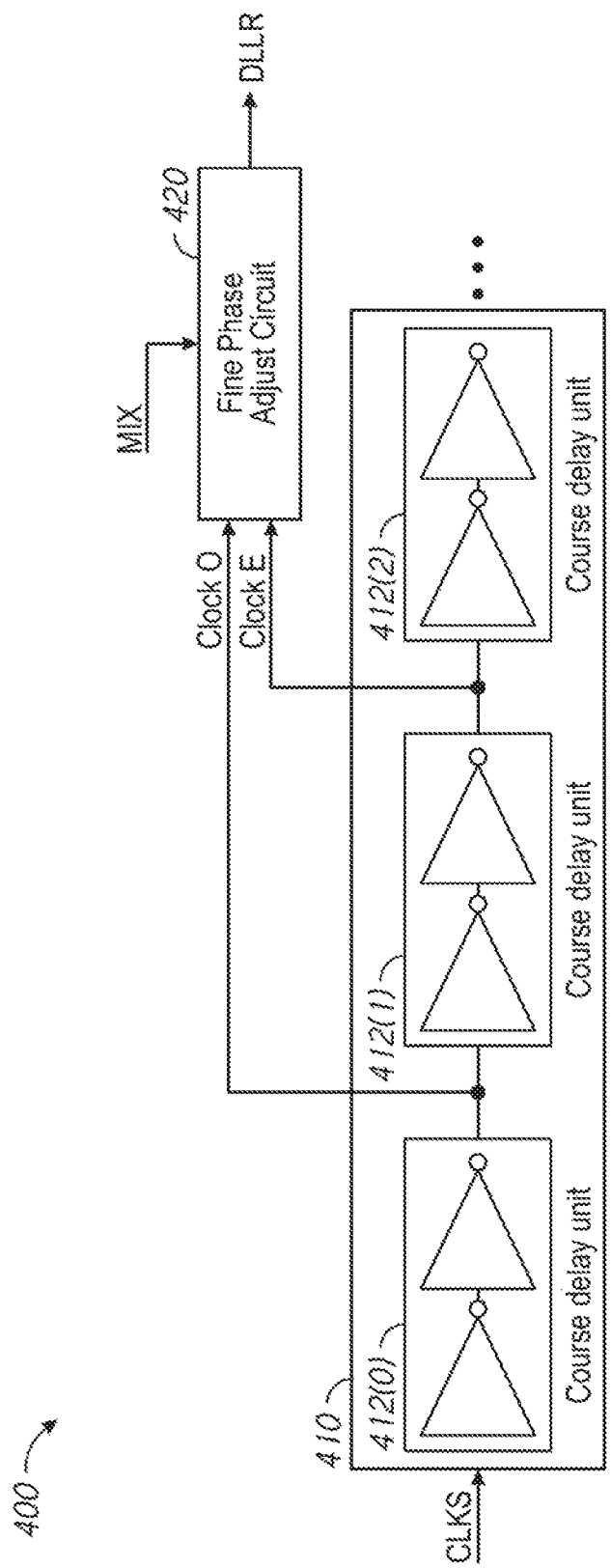
FIG. 4 is a block diagram of an adjustable delay circuit according to an embodiment of the disclosure.

FIG. 4 is a block diagram of an adjustable delay circuit 400 according to an embodiment of the disclosure. The adjustable delay circuit 400 may be included in the adjustable delay circuit 210 of FIG. 2 in some embodiments of the disclosure.

The adjustable delay circuit 400 includes a coarse delay line 410 and a fine phase adjust circuit 420. The coarse delay line 410 includes a plurality of unit delay stages, of which, unit delay stages 412(0)-412(2) are shown. Each of the unit delay stages 412 provides a unit delay time when activated. In some embodiments of the disclosure, the unit delay time of a unit delay stage is provided by series coupled logic gates, which when activated, may be represented by series coupled inverter circuits, as shown in FIG. 4. The fine phase adjust circuit 420 receives a clock O provided by the unit delay stage 412(0) and a clock E provided by the unit delay stage 412(1). The E clock is phase shifted relative to the O clock due to the unit delay time of unit delay stage 412(1).

The fine phase adjust circuit 420 provides an output clock DLLR that is based on the O and E clocks. For example, the O and E clocks are weighted and combined by the fine phase adjust circuit 420 to provide the DLLR clock. The weighting of the O and E clocks is controlled by control signal MIX. The timing of the DLLR clock may be adjusted by changing the weighting of the O and B clocks. For example, the timing of the DLLR clock may be adjusted over the phase difference of the O clock and the E clock, which in FIG. 4 is shown to correspond to one unit delay time of a unit delay stage. The range of adjustment of the DLLR clock is over the phase difference between the O clock and the E clock. As an example, where the O and E clocks are weighted evenly, the fine phase adjust circuit 420 provides a DLLR clock having a timing at halfway between the phase difference between the O clock and the E clock.

Figure 5:
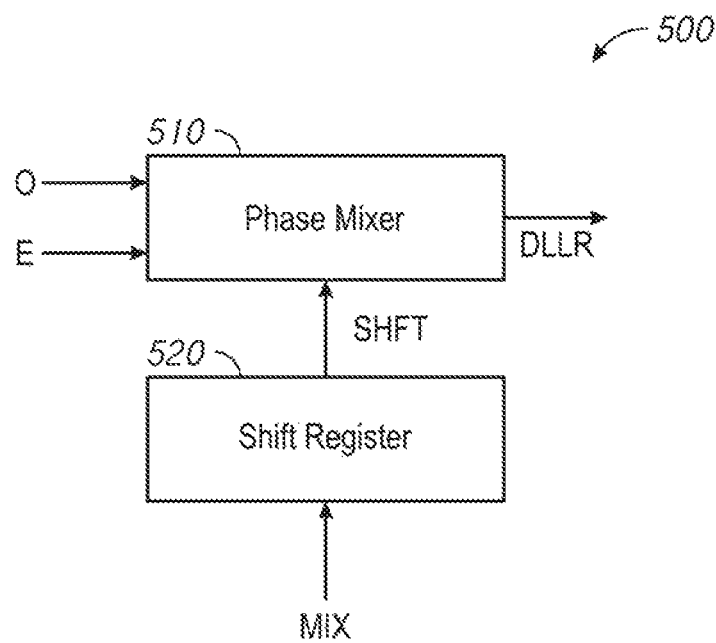
FIG. 5 is a block diagram of a fine phase adjust circuit according to an embodiment of the disclosure.

FIG. 5 is a block diagram of a fine phase adjust circuit 500 according to an embodiment of the disclosure. The fine phase adjust circuit 500 may be included in the fine phase adjust circuit 420 of FIG. 4 in some embodiments of the disclosure.

The fine phase adjust circuit 500 includes a phase mixer circuit 510 and a shift register 520. The phase mixer circuit 510 receives input clocks O and E. The O and E clocks have a phase difference between them. The phase difference between the O and E clocks may be provided by the E clock having a delay relative to the O clock. The O and E clocks may be provided by, for example, a coarse delay line having unit delay stages, and the O and E clocks may have a phase difference corresponding to the delay of a unit delay stage. The phase mixer circuit 510 combines the O and E clocks as weighted by a control signal SHFT to provide an output clock DLLR. The SHFT signal is provided by the shift register 520. The SHFT signal may be a multibit signal in some embodiments of the disclosure. The shift register 520 provides the SHFT signal based on a control signal MIX, which indicates the weighting of the O and E clocks for providing the DLLR clock. The shift register 520 may operate in a mode where the delay provided by the phase mixer circuit 510 is adjusted incrementally, for example, during normal operations. The incremental delay adjustment provides a minimum delay adjustment. Additionally, the shift register 520 may operate in a mode where the delay provided by the phase mixer circuit 510 is adjusted in larger steps than when adjusted incrementally, for example, following/during initialization of a clock generator circuit that includes the fine phase adjust circuit 500. The delay adjustment by larger steps provides larger adjustments than the minimum delay adjustments.

Figure 6:
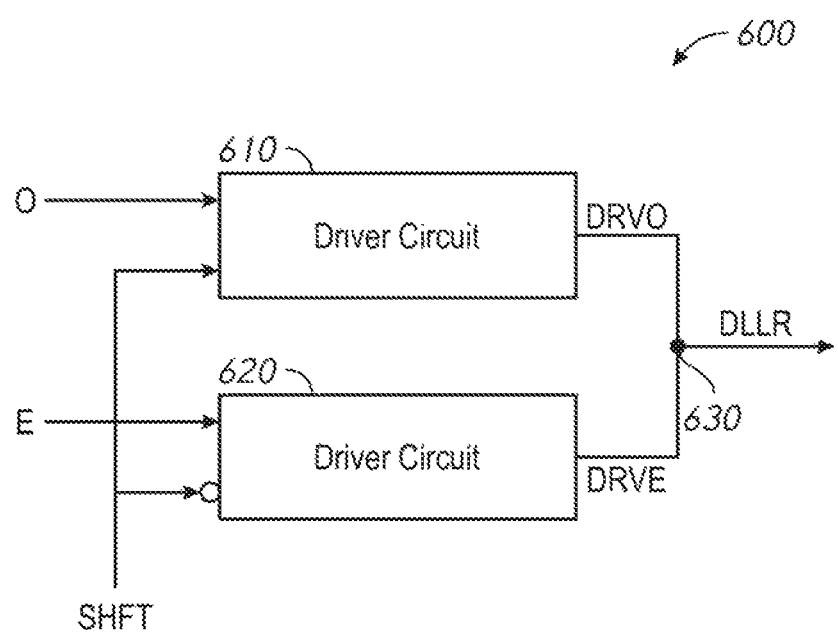
FIG. 6 is a block diagram of a phase mixer circuit according to an embodiment of the disclosure.

FIG. 6 is a block diagram of a phase mixer circuit 600 according to an embodiment of the disclosure. The phase mixer circuit 600 may be included in the phase mixer circuit 510 of FIG. 5 in some embodiments of the disclosure.

The phase mixer circuit 600 includes a driver circuit 610 and a driver circuit 620. The driver circuit 610 receives an input clock O and provides an output clock DRVO to an output node 630. The drive strength of the driver circuit 610 when providing the DRVO clock is controlled by a control signal SHFT. The driver circuit 620 receives an input clock E and provides an output clock DRVE to the output node 630. The drive strength of the driver circuit 620 when providing the DRVE clock is controlled by the SHFT signal. An output clock DLLR is provided at the output node 630. The DLLR clock is a combination of the DRVO and DRVE clocks. For example, the DRVO and DRVE clocks are combined together at the output node 630 to provide the DLLR clock.

A timing of the DLLR clock may be adjusted by changing the weighting of the O clock and the E clock in providing the DRVO and DRVE clocks, respectively. Changing the weighting results in changing the drive strengths of the respective driver circuits 610 and 620. The range of timing adjustment for the DLLR clock corresponds to a phase difference between the O clock and the E clock. The weighting for the O and E clocks may be changed to adjust a timing of the DLLR clock over the range provided by the phase difference between the O and E clocks. For example, when the O clock and E clock are weighted equally, the driver strengths of the driver circuits 610 and 620 are equal, and the resulting DLLR clock has a timing relative to the O clock that is one half the phase difference between the O clock and the E clock. When the O clock has full weight and the E clock has no weight, the driver circuit 610 is at maximum drive strength and the driver circuit 620 is at minimum drive strength, resulting in a DLLR clock that is nearly in phase with the O clock. Conversely, when the E clock has full weight and the O clock has no weight, the driver circuit 610 is at minimum drive strength and the driver circuit 620 is at maximum drive strength, resulting in a DLLR clock that is nearly in phase with the E clock.

Figure 7:
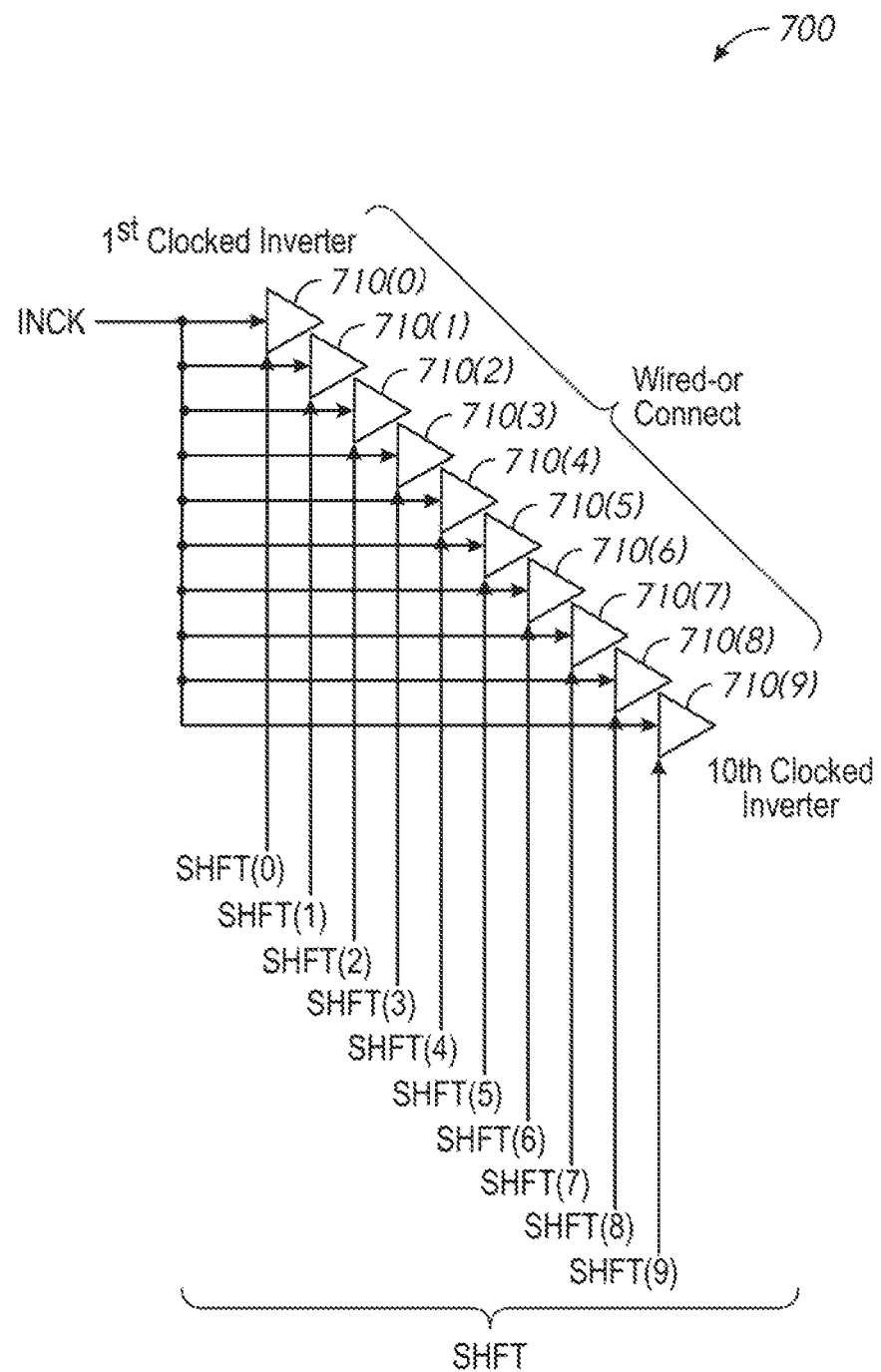
FIG. 7 is a schematic diagram of a driver circuit according to an embodiments of the disclosure.

FIG. 7 is a schematic diagram of a driver circuit 700 according to an embodiment of the disclosure. The driver circuit 700 may be included in the driver circuit 610 and/or the driver circuit 620 in, some embodiments of the disclosure. The driver circuit 700 receives an input clock INCK and a control signal SHFT. The SHFT signal may include a plurality of control signals. The INCK clock may be either the O clock or the E clock in embodiments where the driver circuit 700 is included in the driver circuit 610 and/or driver circuit 620.

The driver circuit 700 includes signal driver circuits 710(0)-710(9), each of which receives the INCK clock. Each of the signal driver circuits 710(0)-710(9) receives a respective one of the control signals included in the SHFT signal. For example, the signal driver circuit 710(0) receives the SHFT(0) signal, the signal driver circuit 710(1) receives the SHFT(1) signal, the signal driver circuit 710(2) receives the SHFT(2) signal, and so on. Each of the signal driver circuits 710(0)-710(9) is activated by an active respective SHFT signal (e.g., active high logic level). When activated, a signal driver circuit 710 drives the INCK clock to a common output node (not shown in FIG. 7) at which an output clock is provided. The signal driver circuits 710 are "wired OR" coupled to the common output node.

The output clock may be either the DRVO clock or the DRVE clock in embodiments where the driver circuit 700 is included in the driver circuit 610 and/or driver circuit 620. The resulting output clock is driven with a drive strength that is related to the number of signal driver circuits 710(0)-710(9) that are activated. For example, the output clock is driven with a greater drive strength when more signal driver circuits 710 are activated, and conversely, driven with lesser drive strength when fewer signal driver circuits 710 are activated. Thus, the drive strength may be controlled by the SHFT signal. Changing the drive strength of the signal driver circuits causes a timing of the output clock to change.

In operation, each of the driver circuits 710 are activated when the corresponding SHFT signal indicates "1". In embodiments where the driver circuit 700 is included in both the driver circuit 610 and driver circuit 620, one of the driver circuits operates according to the true SHFT signals, and the other driver circuit operates according to the complement of the SHFT signals. For example, when the 10 bits are "0000011111" (as represented by the SHFT signals), the 1st to 5th signal driver circuits are not activated and the 6th to 10th signal driver circuits are activated in the first driver circuit, while the 1st to 5th signal driver circuits are activated and the 6th to 10th signal driver circuits are not activated in the second driver circuit. The drive strengths of the driver circuits 610 and 620 are equal and the resulting DLLR clock becomes weighted as Odd: 50%, Even 50%. When the 10 bits are "0000111111" (as represented by the SHFT signals), six signal driver circuits are activated in one of the driver circuits and four signal driver circuits are activated in the other driver circuit. When the bits are all "1", all the signal driver circuits in one of the driver circuits are activated, and all the signal driver circuits in the other driver circuit are not activated. The driver circuit 700 is shown as including 10 signal driver circuits. Other embodiments of the disclosure may include greater or fewer signal driver circuits, however.

Figure 8:
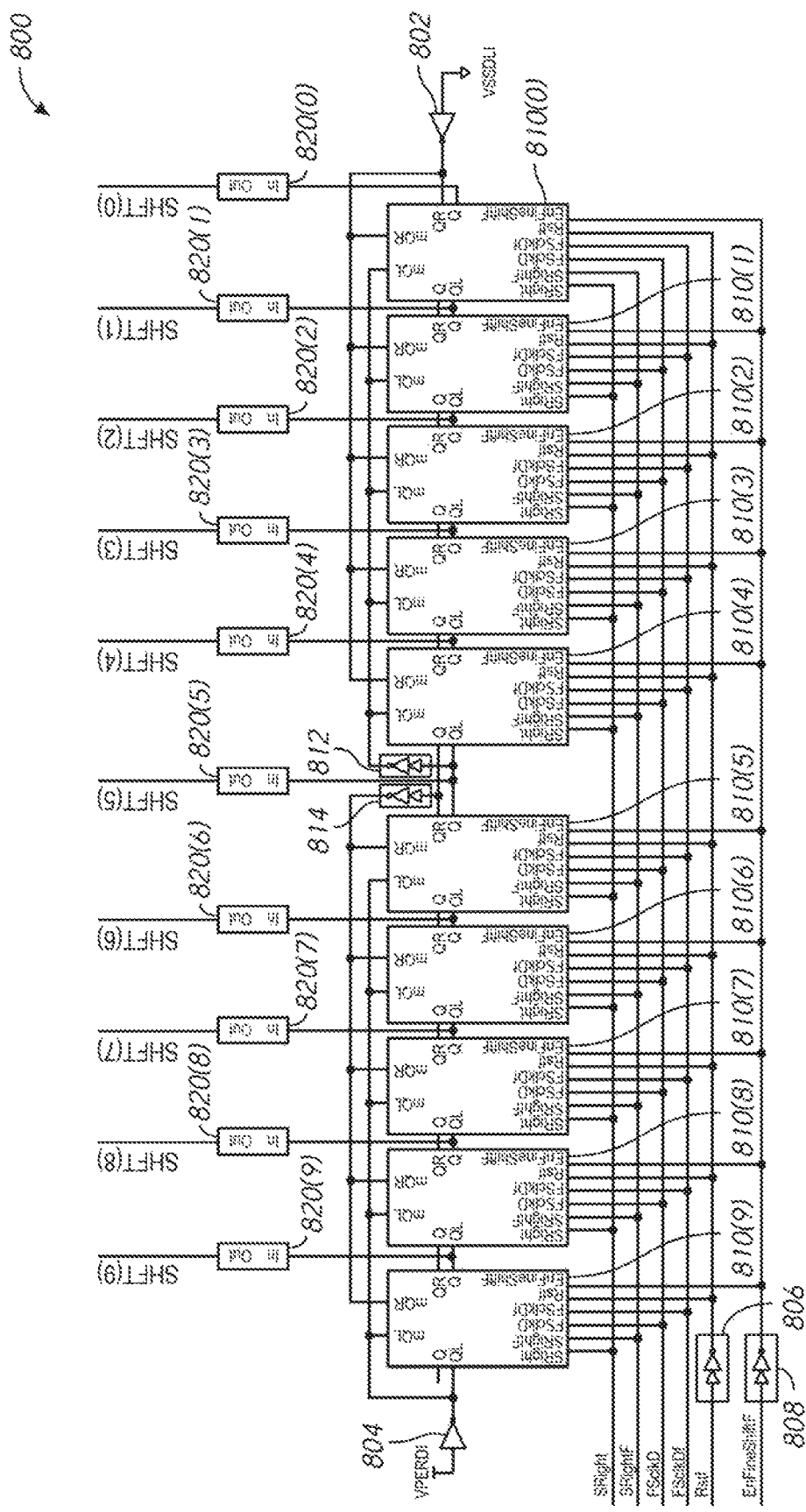
FIG. 8 is a schematic diagram of a shift register circuit according to an embodiment of the disclosure.

FIG. 8 is schematic diagram of a shift register circuit 800 according to an embodiment of the disclosure. The shift register circuit 800 may be included in the shift register circuit 520 of FIG. 5 in some embodiments of the disclosure.

The shift register circuit 800 includes shift registers 810(0)-810(9). The shift registers 810(0)-810(9) are coupled in series, and receive various control signals and clock. The shift registers 810(0)-810(9) receive control signals SRight and SRightF that control a shift direction for a shift register. That is, the SRight and SRightF signals control from which node of the shift register data is received. For example, an active SRight signal (e.g., high logic level) an inactive SRightF signal (e.g., low logic level) controls the shift register 810 to receive data provided to input nodes QR, or mQR of the shift register 810 and provide the data value to the output nodes Q (e.g., left Q node and right Q node) responsive to shift clocks FSclkD and FSclkDF. An inactive SRight signal (e.g., low logic level) and inactive SRightF signal (e.g., high logic level) control the shift register 810 to receive data provided to input nodes QL or mQL nodes of the shift register 810 and provide the data to the left Q node and the right Q node responsive to the FSclkD and FSclkDF clocks. The FSclkD and FSclkDF clocks are complementary.

Selection of which input data (e.g., data received at the QR and QL nodes or data received at the mQR and mQL nodes) to provide to the left and right Q nodes is controlled by control signal EnFineShiftF. For example, an active EnFineShiftF signal (e.g., low logic level) controls the shift registers 810(0)-810(9) to provide the data from the respective QR and QL nodes, while an inactive EnFineShiftF signal (e.g., high logic level) controls the shift registers 810(0)-810(9) to provide the data from the respective mQR and mQL nodes.

A reset signal RstF is also provided to the shift registers 810(0)-810(9). An active RstF signal (e.g., low logic level) controls the shift registers 810(0)-810(9) to reset to a known data value that is based on input data value to the respective shift register 810(0)-810(9).

The shift register 810(0) is provided at its QR and mQR nodes an output from inverter circuit 802. The inverter circuit 802 has an input coupled to a low logic level power supply, causing the inverter circuit 802 to provide a high logic level input to the shift register 810(0). The shift register 810(1) receives at its QR node the output from the left Q node of the shift register 810(0); the shift register 810(2) receives at its QR node the output from the left Q node of the shift register 810(1); the shift register 810(3) receives at its QR node the output from the left Q node of the shift register 810(2); and the shift register 810(4) receives at its QR node the output from the left Q node of the shift register 810(3). The left Q node of the shift register 810(4) provides its output to the QR node of the shift register 810(5) and to the buffer 814. The shift register 810(0) receives at its QL node the output from the right Q node of the shift register 810(1); the shift register 810(1) receives at its QL node the output from the right Q node of the shift register 810(2); the shift register 810(2) receives at its QL node the output from the right Q node of the shift register 810(3); and the shift register 810(3) receives at its QL node the output from the right Q node of the shift register 810(4). The shift register 810(4) receives at its QL node the output from the right Q node of the shift register 810(5). The output from the right Q node of the shift register 810(5) is also provided to the mQL nodes of the shift registers 810(0)-810(4) by way of buffer 812.

The shift register 810(9) is provided at its QL and mQL nodes an output from inverter circuit 804. The inverter circuit 804 has an input coupled to a high logic level power supply, causing the inverter circuit 804 to provide a low logic level input to the shift register 810(9). The shift register 810(8) receives at its QL node the output from the right Q node of the shift register 810(9); the shift register 810(7) receives at its QL node the output from the right Q node of the shift register 810(8); the shift register 810(6) receives at its QL node the output from the right Q node of the shift register 810(7); and the shift register 810(5) receives at its QL node the output from the right Q node of the shift register 810(6). The right Q node of the shift register 810(5) provides its output to the QL node of the shift register 810(4) and to the buffer 812, as previously described. Additionally, the shift register 810(9) receives at its QR node the output from the left Q node of the shift register 810(8); the shift register 810(8) receives at its QR node the output from the left Q node of the shift register 810(7); the shift register 810(7) receives at its QR node the output from the left Q node of the shift register 810(6); and the shift register 810(6) receives at its QR node the output from the left Q node of the shift register 810(5). The shift register 810(5) receives at its QR node the output from the left Q node of the shift register 810(4). The output from the left Q node of the shift register 810(4) is also provided to the mQR nodes of the shift registers 810(5)-810(9) by way of the buffer 814.

Each of the shift registers 810(0)-810(9) further provides an output from its respective right Q node to a respective register 820(0)-820(9). The outputs from the right Q nodes are stored by the respective register 820(0)-820(9), which each provides a respective control signal SHFT(0)-SHFT(9). The SHFT(0)-SHFT(9) signals may be included in a control signal SHFT. In some embodiments of the disclosure, the SHFT(0)-SHFT(9) signals are included in a SHFT signal that may be provided, for example, to a phase mixer to control weighting of input clocks (e.g., O clock and E clock) in providing an output clock DLLR.

The buffers 812 and 814 are shown in FIG. 8 as including series coupled inverter circuits. However, buffers including alternative or additional circuits may be used as well in other embodiments of the disclosure.

As will be described in greater detail below, the shift register circuit 800 may be controlled to shift data one register at a time to the left (e.g., toward shift register 810(9)) or to the right (e.g., toward shift register 810(0)). The data values are changed by individual shift registers. The shift register circuit 800 may also be controlled to shift data to more than one register at a time to the left or to the right. The data values are changed by a group of shift registers. The shift register circuit 800 has the shift register stages 810(0)-810(9) divided into two groups of shift registers to provide shifting of data to the left or right for two different groups of shift registers. The two groups of shift registers of the shift register circuit 800 are: (1) shift registers 810(0)-810(4) and (2) shift registers 810(5)-810(9). Control of the shift operation for one register or multiple registers at a time is provided by the EnFineShiftF signal. Operation of the shift register circuit 800 according to various embodiments of the disclosure will be described below with reference to FIGS. 10A-10D.

Figure 9:
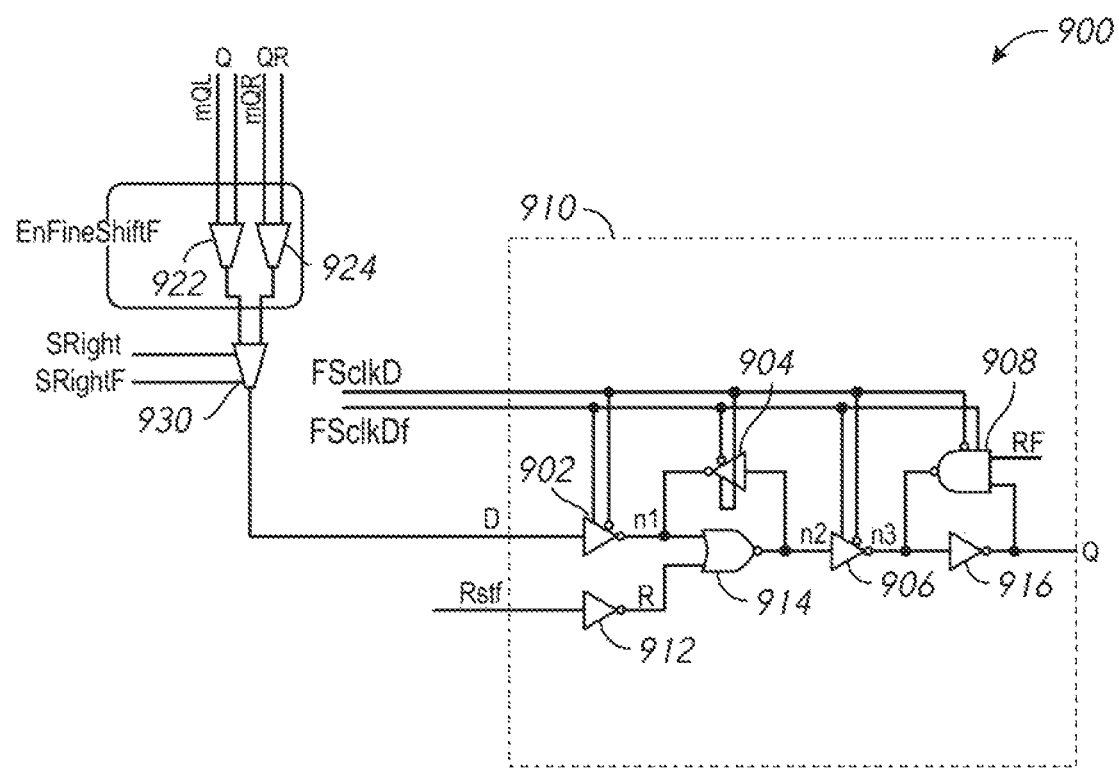
FIG. 9 is a schematic diagram of a shift register according to an embodiment of the disclosure.

FIG. 9 is a schematic diagram of a shift register 900 according to an embodiment of the disclosure. The shift register 900 may be included in one or more of the shift registers 810 of FIG. 8 in some embodiments of the disclosure.

The shift register 900 includes a shift stage 910, and multiplexer circuits 920 and 930. The shift stage 910 includes inverter circuits 912 and 916, and NOR logic gate 914. The shift stage 910 further includes clocked inverter circuits 902, 904, and 906, and NAND logic gate 908, each of which is provided shift clocks FSclkD and FSclkDF. The FSclkD and FSclkDF clock are complementary. When activated, the clocked inverter circuits 902, 904, and 906, and NAND logic gate 908 are activated to provide an output that is the complement of an input. The clocked inverter circuit 902 and NAND logic gate 908 are activated when the FSclkD clock changes to a low clock level (and the FSclkDF clock changes to a high clock level), and the clocked inverter circuits 904 and 906 are activated when the FSclkD clock changes to a high clock level (and the FSclkDF clock changes to a high clock level).

The inverter circuit 912 and the clocked NAND logic gate 908 are provided a reset signal RstF. An active RstF signal (e.g., low logic level) is used to reset the shift register 900 to a known data value. An inactive RstF signal (e.g., high logic level) provides normal operation of the shift register 900. When the RstF signal is inactive, the NOR logic gate 914 effectively operates as an inverter circuit for the output of the clocked inverter circuit 902, and the clocked NAND logic gate 908 operates as a clocked inverter circuit. As a result, when the RstF signal is inactive, the clocked inverter circuit 904 and the NOR logic gate 914 operate as a first clocked latch circuit, and the clocked NAND logic gate 908 and the inverter circuit 916 operate as a second clock latch circuit.

In operation, assuming the RstF signal is inactive, a data value at the input of the clocked inverter 902 is provided as a complement to the first clocked latch when the FSclkD clock changes to a low clock level (and the FSclkDF clock changes to a high clock level). The complement of the original data value is latched by the first clocked latch when the FSclkD clock changes to a high clock level (and the FSclkDF clock changes to a low clock level). The original data value is provided by the NOR logic gate 914 to the clocked inverter circuit 906, which also activated by the high clock level FSclkD clock. The activated clocked inverter circuit 906 provides the complement of the original data value to the second clocked latch. The second clocked latch latches the complementary data value when FSclkD clock changes to a low clock level again, and the inverter circuit 916 provides the original data value to a Q node as an output of the shift register 900. In summary, the shift stage 910 latches a data value at its input on a falling clock edge of the FSclkD clock, and shifts the data value through the shift stage 910 to be provided at its Q node on a next falling clock edge of the FSclkD clock. The shift stage 910 is shown in FIG. 9 as a "reset" type flip flop as the shift stage 910. Thus, the shift stage 910 sets "0" at the node Q when the shift stage 910 receives the active reset signal RstF. The shift stage 910 may also be modified to a "set" type flip flop so that the shift stage 910 sets "1" at the node Q when the shift stage 910 receives the active reset signal RstF. For example, the NOR logic gate 914 may be replaced with a NAND logic gate, and the clocked NAND logic gate 908 may be replaced with a clocked NOR logic gate to modify the shift stage 910 to operate as a set type flip flop. In another example, inverter circuits may be included at the input and output of the shift stage 910 to provide a set type flip flop.

The multiplexer circuit 920 includes multiplexers 922 and 924. The multiplexer 922 is provided data from the mQL and QL nodes and the multiplexer 924 is provided data from the mQR and QR nodes. The multiplexer circuit 920 is controlled by a control signal EnFineShiftF to provide as an output the data from either the QL and QR nodes, or from the mQL and mQR nodes. For example, the multiplexer circuit 920 provides data from the QL and QR nodes when the EnFineShiftF signal is active (e.g., low logic level) and provides data from the mQL and mQR nodes when the EnFineShiftF signal is inactive (e.g., high logic level). The multiplexer circuit 930 is provided the outputs from the multiplexer 922 (data from either the mQL or QL nodes) and from the multiplexer 924 (data from either the mQR or QR nodes). The multiplexer circuit 930 is controlled by control signals SRight and SRightF to provide as an output the data from either the multiplexer 922 or the multiplexer 924.

In operation, the multiplexer circuit 920 is controlled by the EnFineShiftF signal to provide an output selected from either the data provided to the QL and QR nodes or the data provided to the mQL and mQR nodes, and the multiplexer 930 is controlled by the SRight and SRightF signals to provide to the shift stage 910 an output selected from either the data provided to one of the left input nodes or the data provided to one of the right input nodes. By using the EnFineShiftF signal and the SRight and SRightF signals, data provided to one of the inputs QL, QR, mQL, or mQR, is provided to the shift stage 910 for latching and shifting.

Operation of the shift register circuit 800 according to an embodiment of the disclosure will be described with reference to FIGS. 10A-10D. As previously described, the shift register circuit 800 may be controlled to shift data to more than one register at a time to the left or to the right. The data values are changed by a group of shift registers. The EnFineShiftF signal is a high logic level to control the shift register circuit 800 to operate in this manner. FIGS. 10A-10D illustrate operation in this manner for the shift register circuit 800 according to various embodiments of the disclosure.

Figure 10A:
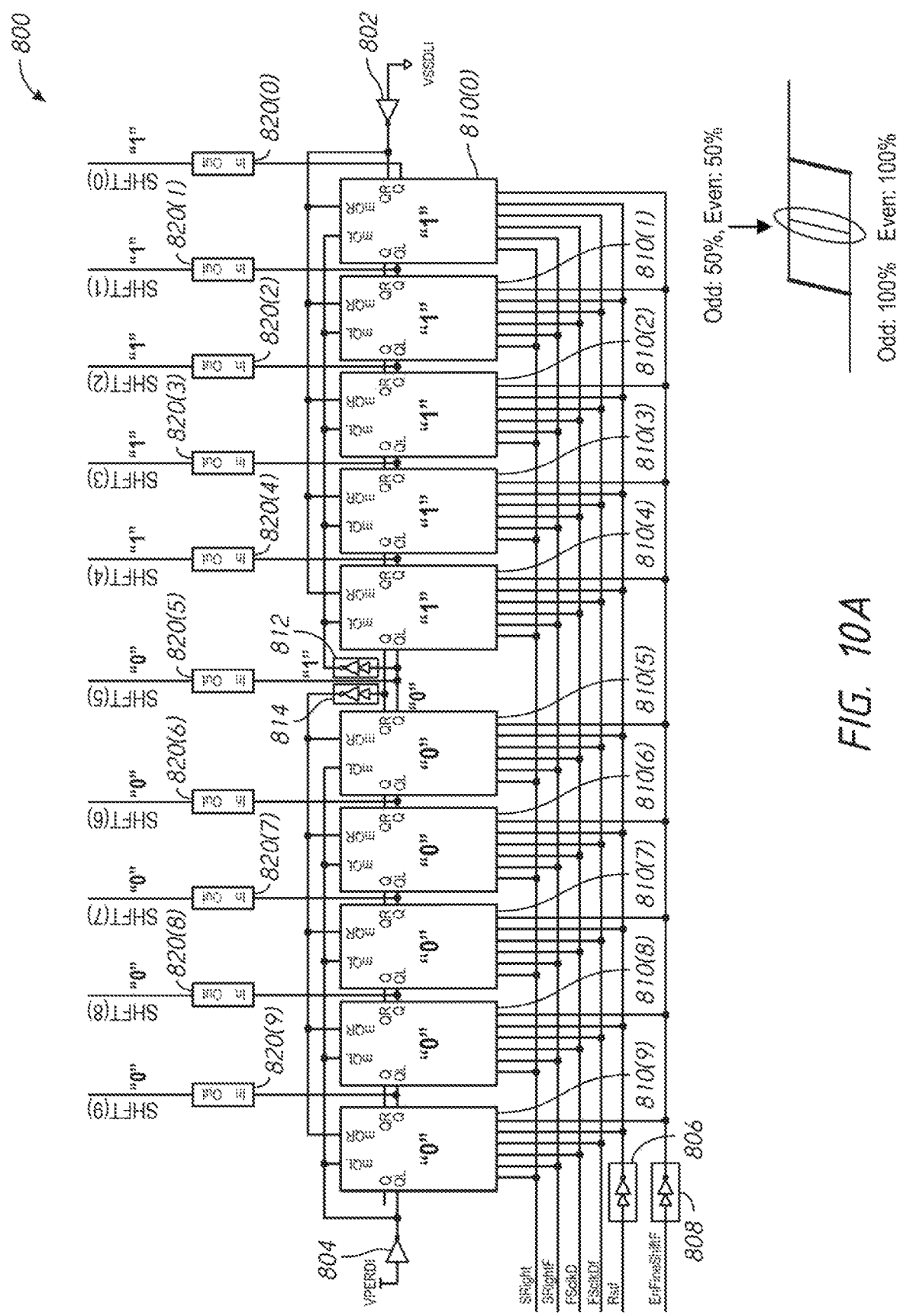
FIGS. 10A-10D illustrate various examples of operation for a shift register circuit according to various embodiments of the disclosure.

FIG. 10A shows a condition of the shift register circuit 800 following a reset by an active RstF signal. The RstF signal is strobed to a low logic level which causes the shift registers 810(0)-810(9) to reset to a known data value. When the RstF signal returns to a high logic level, initial data values are stored by the shift registers 810(0)-810(9) as shown in FIG. 10A. For example, the shift registers 810(0)-810(4) are reset and store high logic data value (e.g., "1") (e.g., shift registers 810(0)-810(4) include a shift stage configured as a set type flip flop), and the shift registers 810(5)-810(9) are reset and store, low logic data value (e.g., "0") (e.g., shift registers 810(5)-810(9) include a shift stage configured as a reset type flip flop).

Thus, as shown by FIG. 10A, following reset of the shift register circuit 800 by an active RstF signal, the shift registers 810(0)-810(4) are set to a "1" and the shift registers 810(5)-810(9) are set of a "0". The corresponding SHFT signal provided by the registers 820(0)-820(9) includes SHFT(0)-SHFT(4) as "1" and SHFT(5)-SHFT(9) as "0".

In embodiments of the disclosure where the SHFT(0)-SHFT(9) signals are provided to a phase mixer circuit (e.g., phase mixer circuit 510 of FIG. 5), following reset of the shift register circuit 800, clocks provided to the phase mixer circuit (e.g., O clock and E clock) are equally weighted and the resulting DLLR clock has a fine delay of one-half (50%) of the total range of fine delay provided by the phase mixer circuit.

Figure 10B:
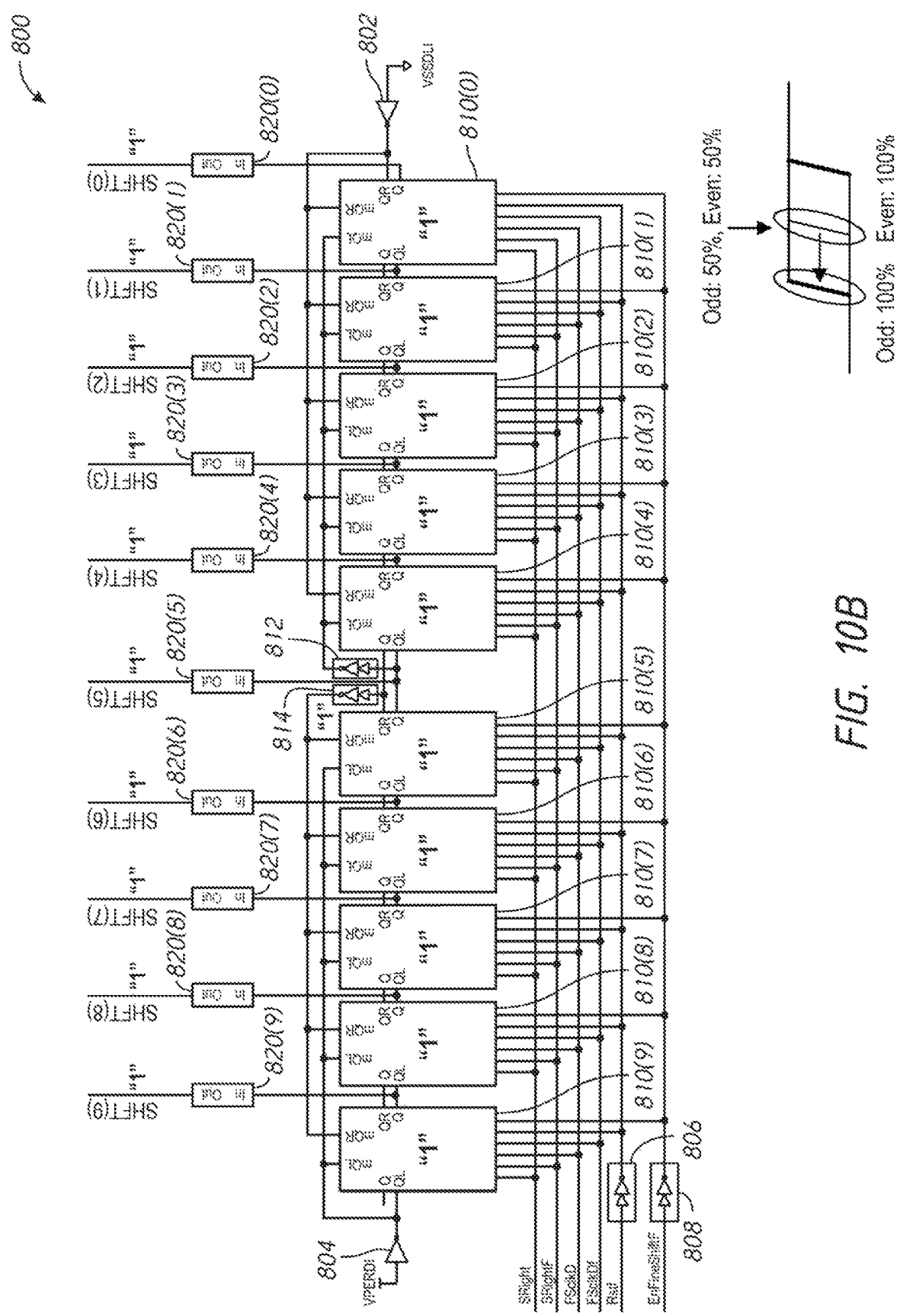

FIG. 10B shows a condition of the shift register circuit 800 when controlled to shift data to more than one register at a time to the left (e.g., toward the shift register 810(9)) following the shift registers 810(0)-810(4) storing a "1" data value and the shift registers 810(5)-810(9) storing a "0" data value (e.g., condition shown in FIG. 10A). The EnFineShiftF is at a high logic level, and consequently, data input from the mQR nodes are latched by the shift registers 810(0)-810(4) and data input from the mQL nodes are latched by the shift registers 810(5)-810(9). The shift registers 810(5)-810(9) are controlled by the SRight and SRightF signals to output at the respective Q nodes the data at the mQR nodes. As a result, the "1" data value stored by the shift register 810(4) and provided through the buffer 814 to the mQR nodes of the shift registers 810(5)-810(9) is latched to set all of the shift registers 810(5)-810(9) to store "1" data. The "1" data value latched by the shift registers 810(5)-810(9) causes the corresponding SHFT(5)-SHFT(9) signals to change to "1", which results in the shift register circuit 800 providing SHFT(0)-SHFT(9) signals that are all "1".

In embodiments of the disclosure where the SHFT(0)-SHFT(9) signals are provided to a phase mixer circuit, one of the clocks provided to the phase mixer circuit has full weight and the other clock has no weight (e.g., O clock has full weight (100%) and E clock has no weight (0%)), and the resulting DLLR clock has a timing that is based on the fully weighted clock (e.g., based on the timing of the O clock and not the E clock).

Figure 10C:
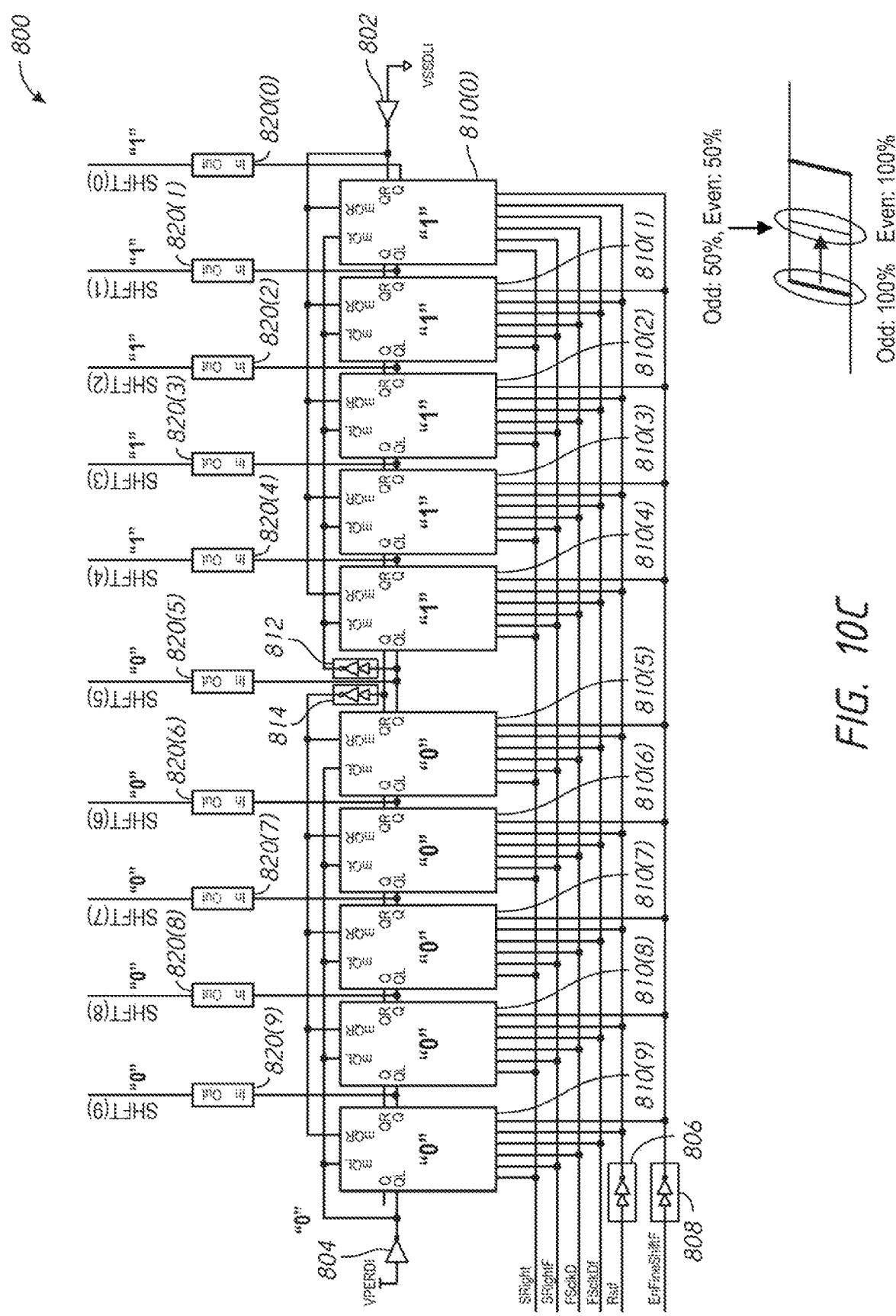

FIG. 10C shows a condition of the shift register circuit 800 when controlled to shift data to more than one register at a time to the right (e.g., toward the shift register 810(0)) following all of the shift registers 810(0)-810(9) storing "1" data (e.g., condition shown in FIG. 10B). The EnFineShiftF is at the high logic level so that the mQR and mQL nodes are input to the shift registers 810(0)-810(9). The shift registers 810(5)-810(9) are controlled by the SRight and SRightF signals to output at the respective Q nodes the data at the mQL nodes. As a result, the "0" data value provided by the inverter 804 and provided to the mQL nodes of the shift registers 810(5)-810(9) is latched to set all of the shift registers 810(5)-810(9) to store "0" data. The "0" data value latched by the shift registers 810(5)-810(9) causes the corresponding SHFT(5)-SHFT(9) signals to change to "0", which results in the shift register circuit 800 providing SHFT(0)-SHFT(4) as "1" and SHFT(5)-SHFT(9) as "0".

As previously described, in embodiments of the disclosure where the SHFT(0)-SHFT(9) signals are provided to a phase mixer circuit, providing a SHFT signal including SHFT(0)-SHFT(9) signals having half "1" and the other half "0" causes the phase mixer circuit to equally weight the input clocks (e.g., O clock and E clock), resulting in a DLLR clock having a fine delay of one-half (50%) of the total range of fine delay provided by the phase mixer circuit.

Figure 10D:
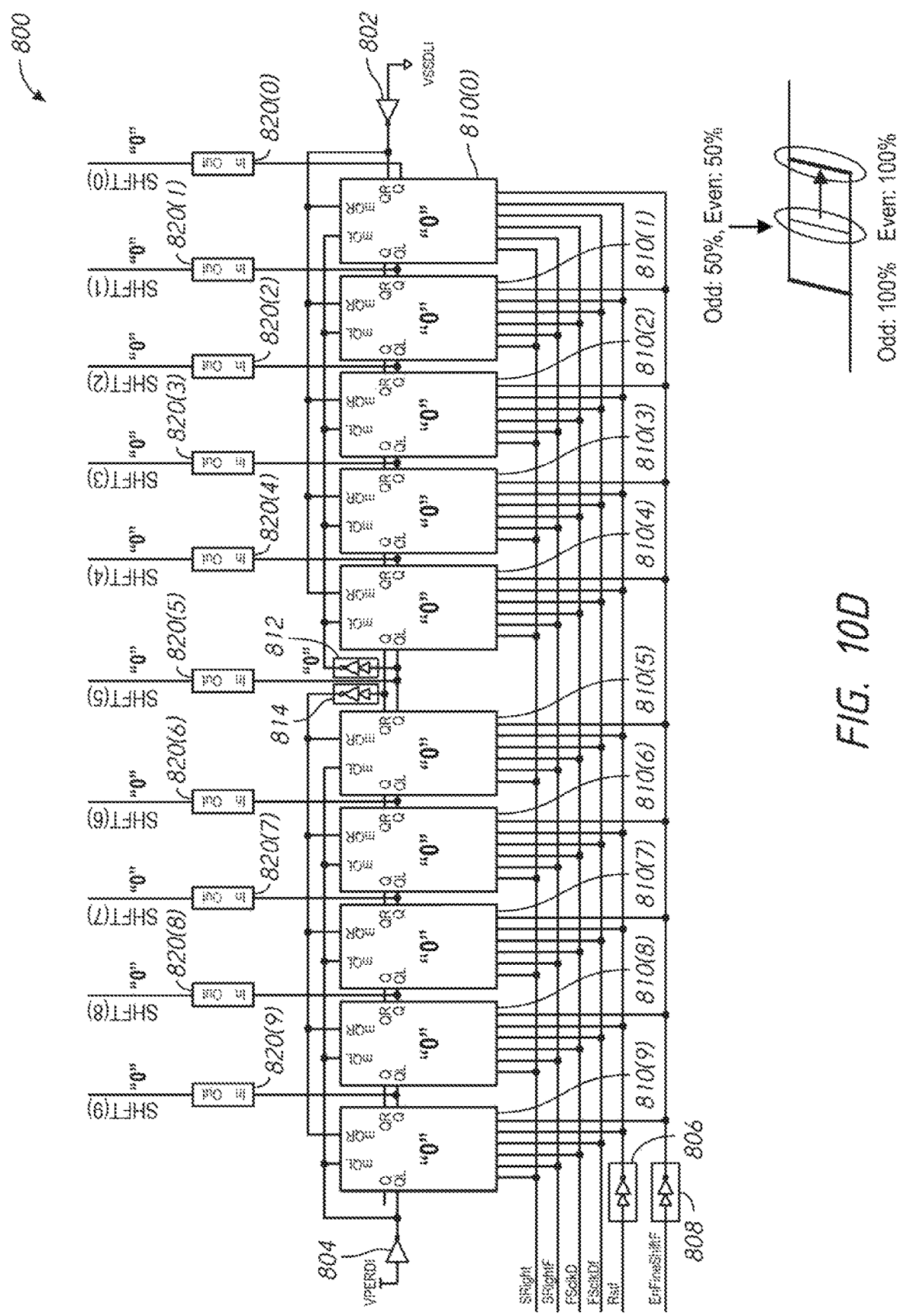

FIG. 10D shows a condition of the shift register circuit 800 when controlled to shift data to more than one register at a time to the right (e.g., toward the shift register 810(0)) following the shift registers 810(0)-810(4) storing "1" data and the shift registers 810(5)-810(9) storing "0" data (e.g., conditions shown in FIGS. 10A and 10C). The EnFineShiftF is at the high logic level so that the mQR and mQL nodes are input to the shift registers 810(0)-810(9). The shift registers 810(0)-810(4) are controlled by the SRight and SRightF signals to output at the respective Q nodes the data at the mQL nodes. As a result, the "0" data value stored by the shift register 810(5) and provided through the buffer 812 to the mQL nodes of the shift registers 810(0)-810(4) is latched to set all of the shift registers 810(0)-810(4) to store "0" data. The "0" data value latched by the shift registers 810(0)-810(4) causes the corresponding SHFT(0)-SHFT(4) signals to change to "0", which results in the shift register circuit 800 providing SHFT(0)-SHFT(9) signals that are all "0".

In embodiments of the disclosure where the SHFT(0)-SHFT(9) signals are provided to the phase mixer circuit, one of the clocks provided to the phase mixer circuit has no weight and the other clock has full weight (e.g., O clock has no weight (0%) and E clock has full weight (100%)), and the resulting DLLR clock has a timing that is based on the fully weighted clock (e.g., based on the timing of the E clock and not the O clock).

As illustrated by the examples of FIGS. 10A-10D, the shift register circuit 800 may be controlled to shift data to more than one register at a time to the left or to the right. In the particular examples, data is shifted between two groups of shift registers 810(0)-810(9) at a time. The data values are changed by a group of shift registers. As previously described, the shift register stages 810(0)-810(9) are divided into two groups of shift registers to provide shifting of data to the left or right to two different groups of shift registers: (1) shift registers 810(0)-810(4); and (2) shift registers 810(5)-810(5). In this manner, a fine delay provided by a fine phase adjust circuit may be quickly adjusted to provide one of three different fine delays, rather than limited to being incrementally adjusted by one shift register 810 at a time. In the example of shift register circuit 800, the fine delay may be quickly adjusted between (1) 50% weight for first and second clocks; (2) 100% for the first clock and 0% for the second clock; and (3) 0% for the first clock and 100% for the second clock. Quickly adjusting a fine delay may provide faster locking of a clock generator circuit during initialization compared to incremental fine delay adjustment.

Figure 11:
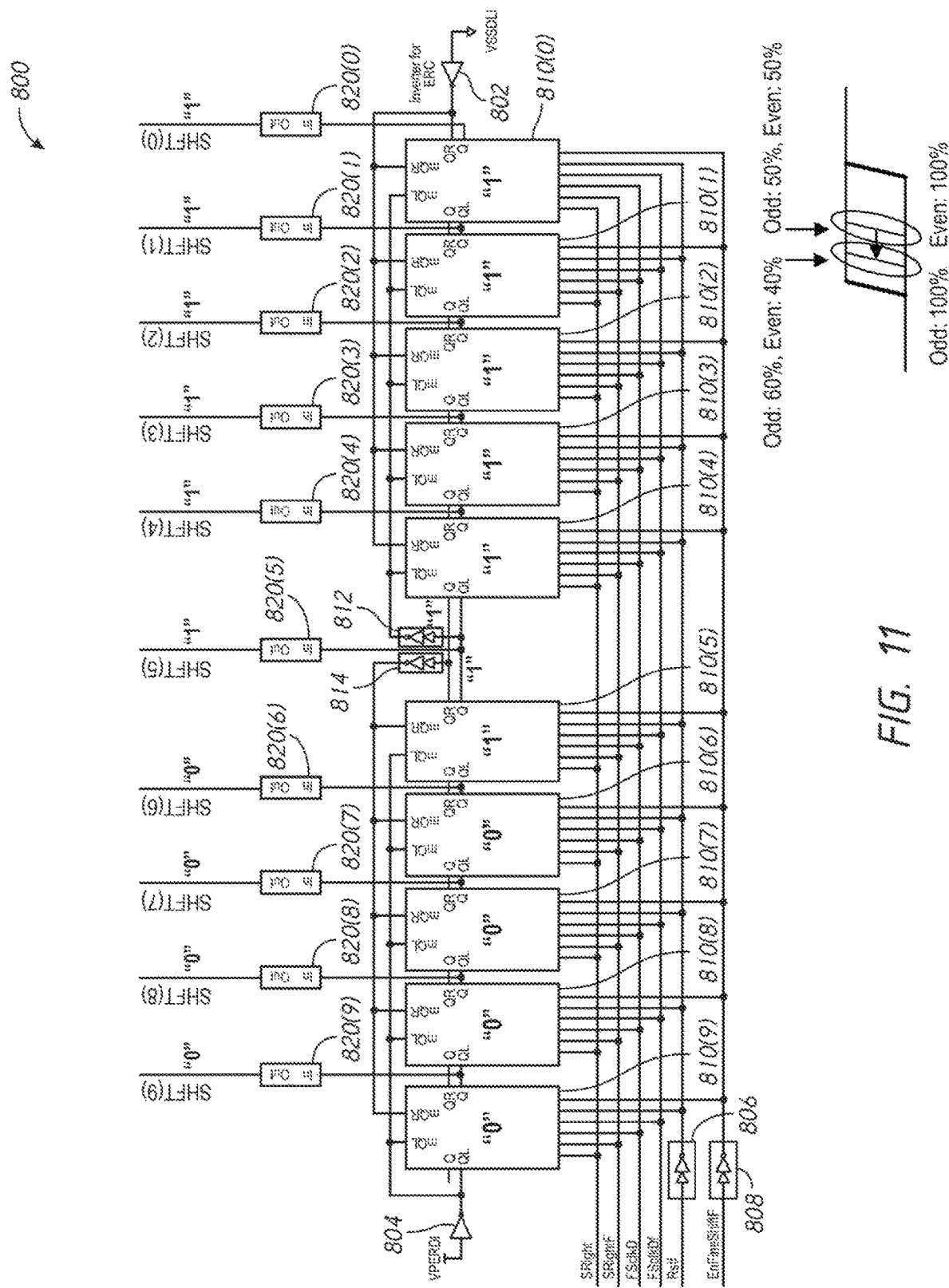
FIG. 11 illustrates an example operation for a shift register circuit according to various embodiments of the disclosure.

Operation of the shift register circuit 800 according to an embodiment of the disclosure will be described with reference to FIG. 11. As previously described, the shift register circuit 800 may be controlled to shift data to one register at a time to the left (e.g., toward shift register 810(9)) or to the right (e.g., toward shift register 810(0)). The data values are changed by individual shift registers. The EnFineShiftF signal is a low logic level to control the shift register circuit 800 to operate in this manner. FIG. 11 illustrates an example operation in this manner for the shift register circuit 800 according to an embodiment of the disclosure.

FIG. 11 shows a condition of the shift register circuit 800 when controlled to shift data to one register at a time to the left (e.g., toward the shift register 810(9)) following the shift registers 810(0)-810(4) storing "1" data and the shift registers 810(5)-810(9) storing "0" data. The EnFineShiftF is at a low logic level so that the QR and QL nodes are input to the shift registers 810(0)-810(9). In FIG. 11, the shift register 810(5) is controlled by the SRight and SRightF signals to output at the respective Q nodes the data at the QR node. As a result, the "1" data value stored by the shift register 810(4) and provided from the left Q node to the QR node of the shift register 810(5) is latched to set the shift register 810(5) to store "1" data. The "1" data value latched by the shift register 810(5) causes the corresponding SHFT(5) signal to change to "1", which results in the shift register circuit 800 providing SHFT(0)-SHFT(5) as "1" and SHFT(6)-SHFT(9) as "0".

In embodiments of the disclosure where the SHFT(0)-SHFT(9) signals are provided to a phase mixer circuit, providing a RIFT signal including SHFT(0)-SHFT(5) signals having "1" and SHFT(6)-SHFT(9) having "0" causes the phase mixer circuit to weight a first clock 60% and weight a second clock 40% (e.g., O clock weighted 60% and the E clock 40%) to provide a DLLR clock having a fine delay based more on the timing of the first clock, in particular, 40% of the total range of fine delay provided by the phase mixer circuit relative to the first clock (e.g., timing closer to the first clock than the second clock). Additional incremental shifting of data one shift register at a time to the left or right may be performed as previously described by having the EnFineShiftF signal at a low logic level and using the SRight and SRightF signals to control shift direction (e.g., control which of the nodes at which data is applied to use for providing an output).

As illustrated by FIG. 11, the shift register circuit 800 may be also controlled to shift data one register at a time to the left or to the right to incrementally change the SHFT(0)-SHFT(9) signals. The data values are changed by individual shift registers. The incremental changes provide a minimum delay adjustment. In the shift register circuit 800, which has 10 shift registers to provide 10 individual control signals, shifting the data by one shift register at a time to the left or right causes a change in the fine delay in increments of 10% of the total range of fine delay. That is, the delay may be adjusted by a minimum of 10% of the total range of fine delay. By providing a shift register circuit that can shift data one shift register at a time (e.g., previously described with reference to FIG. 11), and also shift data to more than one register at a time (e.g., previously described with reference to FIGS. 10A-10D), the fine delay provided by the fine phase adjust circuit may be adjusted incrementally, such as during normal operation following initialization, as well as being adjusted quickly, such as during initialization of a clock generator circuit.

Figure 12:
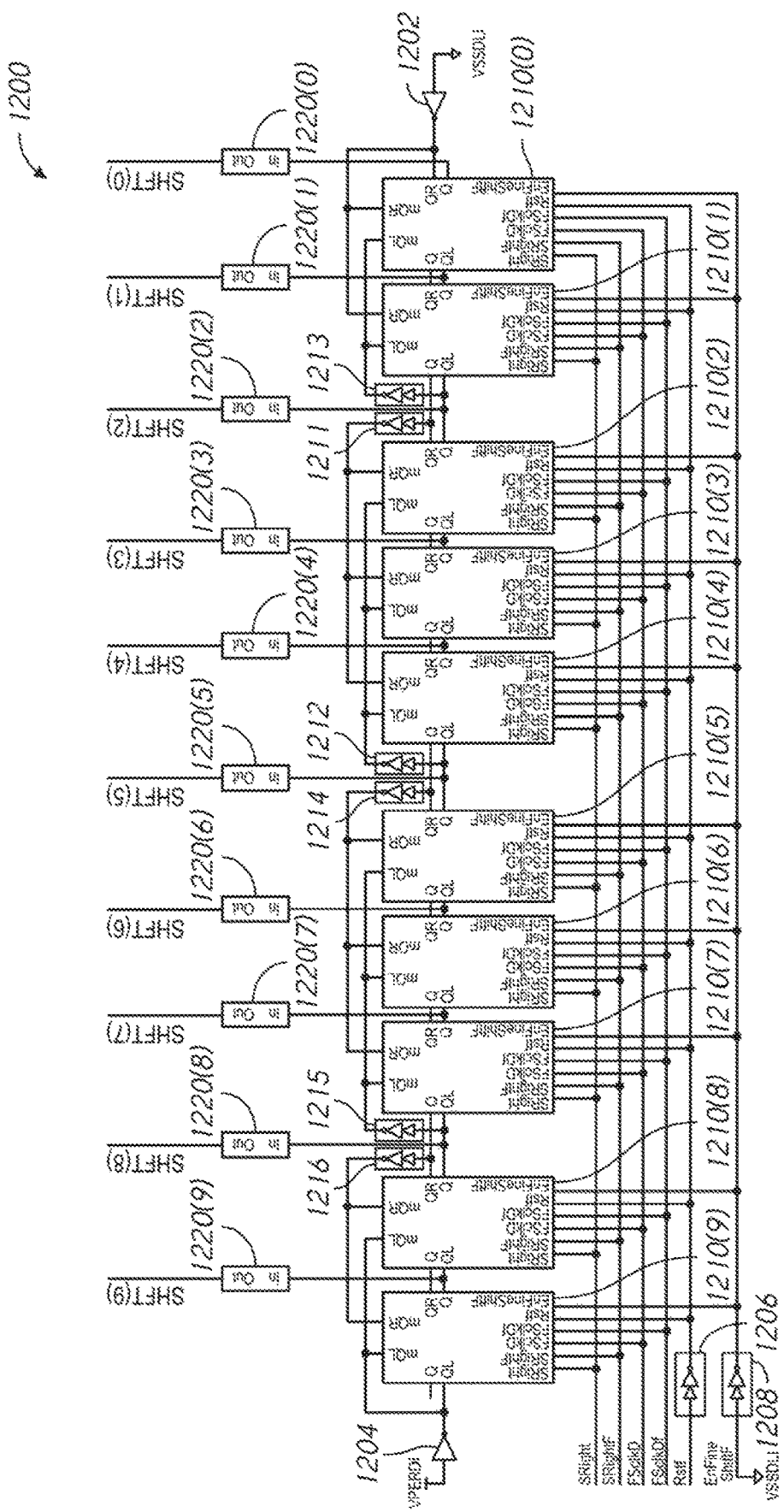
FIG. 12 is a schematic diagram of a shift register circuit according to an embodiment of the disclosure.

FIG. 12 is a schematic diagram of a shift register circuit 1200 according to an embodiment of the disclosure. The shift register circuit 1200 may be included in the shift register circuit 520 of FIG. 5 in some embodiments of the disclosure.

The shift register circuit 1200 includes shift registers 1210(0)-1210(9). The shift registers 1210(0)-1210(9) are coupled in series, and receive various control signals and clocks. The shift registers 1210(0)-1210(9) receive control signals SRight and SRightF that control from which node of the shift register data is received. For example, an active SRight signal (e.g., high logic level) and inactive SRightF signal control the shift register 1210 to receive data provided to input nodes QR or mQR of the shift register 1210 and provide the data to the output nodes Q (e.g., left Q node and right Q node) responsive to shift clocks FSclkD and FSclkDF. An inactive SRight signal (e.g., low logic level) and active SRightF signal control the shift register 1210 to receive data provided to input nodes QL or mQL nodes of the shift register 1210 and provide the data to the left Q node and the right Q node responsive to the FSclkD and FSclkDF clocks. The FSclkD and FSclkDF clocks are complementary.

Selection of which input data (e.g., data received at the QR and QL nodes or data received at the mQR and mQL nodes) to provide to the left and right Q nodes is controlled by control signal EnFineShiftF. For example, an active EnFineShiftF signal (e.g., low logic level) controls the shift registers 1210(0)-1210(9) to provide the data from the respective QR and QL nodes, while an inactive EnFineShiftF signal (e.g., high logic level) controls the shift registers 1210(0)-1210(9) to provide the data from the respective mQR and mQL nodes.

A reset signal RstF is also provided to the shift registers 1210(0)-1210(9). An active RstF signal (e.g., low logic level) controls the shift registers 1210(0)-1210(9) to reset to a known data value that is based on input data to the respective shift register 1210(0)-1210(9).

The shift register 1210(0) is provided at its QR and mQR nodes an output from inverter circuit 1202. The inverter circuit 1202 has an input coupled to a low logic level power supply, causing the inverter circuit 1202 to provide a high logic level input to the QR node of the shift register 1210(0) and to the mQR nodes of the shift registers 1210(0) and 1210(1). The shift register 1210(1) receives at its QR node the output from the left Q node of the shift register 1210(0); the shift register 1210(2) receives at its QR node the output from the left Q node of the shift register 1210(1); the shift register 1210(3) receives at its QR node the output from the left Q node of the shift register 1210(2); and the shift register 1210(4) receives at its QR node the output from the left Q node of the shift register 1210(3). The left Q node of the shift register 1210(4) provides its output to the QR node of the shift register 1210(5) and to the buffer 1214. The output from the left Q node of the shift register 1210(1) is also provided through the buffer 1211 to the mQR nodes of the shift registers 1210(2)-1210(4).

Additionally, the shift register 1210(0) receives at its QL node the output from the right Q node of the shift register 1210(1); the shift register 1210(1) receives at its QL node the output from the right Q node of the shift register 1210(2); the shift register 1210(2) receives at its QL node the output from the right Q node of the shift register 1210(3); and the shift register 1210(3) receives at its QL node the output from the right Q node of the shift register 1210(4). The output of the right Q node of the shift register 1210(2) is also provided to the mQL nodes of the shift registers 1210(1) and 1210(0) through buffer 1213. The shift register 1210(4) receives at its QL node the output from the right Q node of the shift register 1210(5). The output from the right Q node of the shift register 1210(5) is also provided to the mQL nodes of the shift registers 1210(2)-1210(4) by way of buffer 1212.

The shift register 1210(9) is provided at its QL and mQL nodes an output from inverter circuit 1204. The inverter circuit 1204 has an input coupled to a high logic level power supply, causing the inverter circuit 1204 to provide a low logic level input to the shift register 1210(9) and to the mQL nodes of the shift registers 1210(9) and 1210(8). The shift register 1210(8) receives at its QL node the output from the right Q node of the shift register 1210(9); the shift register 1210(7) receives at its QL node the output from the right Q node of the shift register 1210(8); the shift register 1210(6) receives at its QL node the output from the right Q node of the shift register 1210(7); and the shift register 1210(5) receives at its QL node the output from the right Q node of the shift register 1210(6). The output of the right Q node of the shift register 1210(8) is also provided to the mQL nodes of shift registers 1210(5)-1210(7) by way of buffer 1215.

Additionally, the shift register 1210(9) receives at its QR node the output from the left Q node of the shift register 1210(8); the shift register 1210(8) receives at its QR node the output from the left Q node of the shift register 1210(7); the shift register 1210(7) receives at its QR node the output from the left Q node of the shift register 1210(6); and the shift register 1210(6) receives at its QR node the output from the left Q node of the shift register 1210(5). The shift register 1210(5) receives at its QR node the output from the left Q node of the shift register 1210(4). The output from the left Q node of the shift register 1210(4) is also provided to the mQR nodes of the shift registers 1210(5)-1210(7) by way of the buffer 1214. The output from the left Q node of the shift register 1210(7) is also provided to the mQR nodes of the shift registers 1210(8) and 1210(9) through buffer 1216.

Each of the shift registers 1210(0)-1210(9) further provides an output from its respective right Q node to a respective register 1220(0)-1220(9). The outputs from the right Q nodes are stored by the respective register 1220(0)-1220(9), which each provides a respective control signal SHFT(0)-SHFT(9). The SHFT(0)-SHFT(9) signals may be included in a control signal SHFT. In some embodiments of the disclosure, the SHFT(0)-SHFT(9) signals are included in a SHFT signal that may be provided, for example, to a phase mixer to control weighting of input clocks (e.g., O clock and E clock) in providing an output clock DLLR.

The buffers 1211-1216 are shown in FIG. 12 as including series coupled inverter circuits. However, buffers including alternative or additional circuits may be used as well in other embodiments of the disclosure.

As will be described in greater detail below, the shift register circuit 1200 may be controlled to shift data to more than one register at a time to the left (e.g., toward shift register 1210(9)) or to the right (e.g., toward shift register 1210(0)). The data values are changed by a group of shift registers. The shift register circuit 1200 may also be controlled to shift data one register at a time to the left or to the right. The data values are changed by individual shift registers. In contrast to the shift register circuit 800 of FIG. 8, the shift register circuit 1200 has the shift register stages 1210(0)-1210(9) divided into four groups of shift registers to provide shifting of data to the left or right for four different groups of shift registers, instead of two different groups of shift registers as for the shift register circuit 800 of FIG. 8. The four groups of shift registers of the shift register circuit 1200 are: (1) shift registers 1210(0) and 1210(1); (2) shift registers 1210(2)-1210(4); (3) shift registers 1210(5)-1210(7); and (4) shift registers 1210(8) and 1210(9). Control of the shift operation for one register or multiple registers at a time is provided by the EnFineShiftF signal.

Operation of the shift register circuit 1200 according to an embodiment of the disclosure will be described with reference to FIGS. 13A-13G. As previously described, the shift register circuit 1200 may be controlled to shift data to more than one register at a time to the left or to the right. The data values are changed by a group of shift registers. The EnFineShiftF signal is a high logic level to control the shift register circuit 1200 to operate in this manner. FIGS. 13A-13G illustrate operation in this manner for the shift register circuit 1200 according to various embodiments of the disclosure.

Figure 13A:
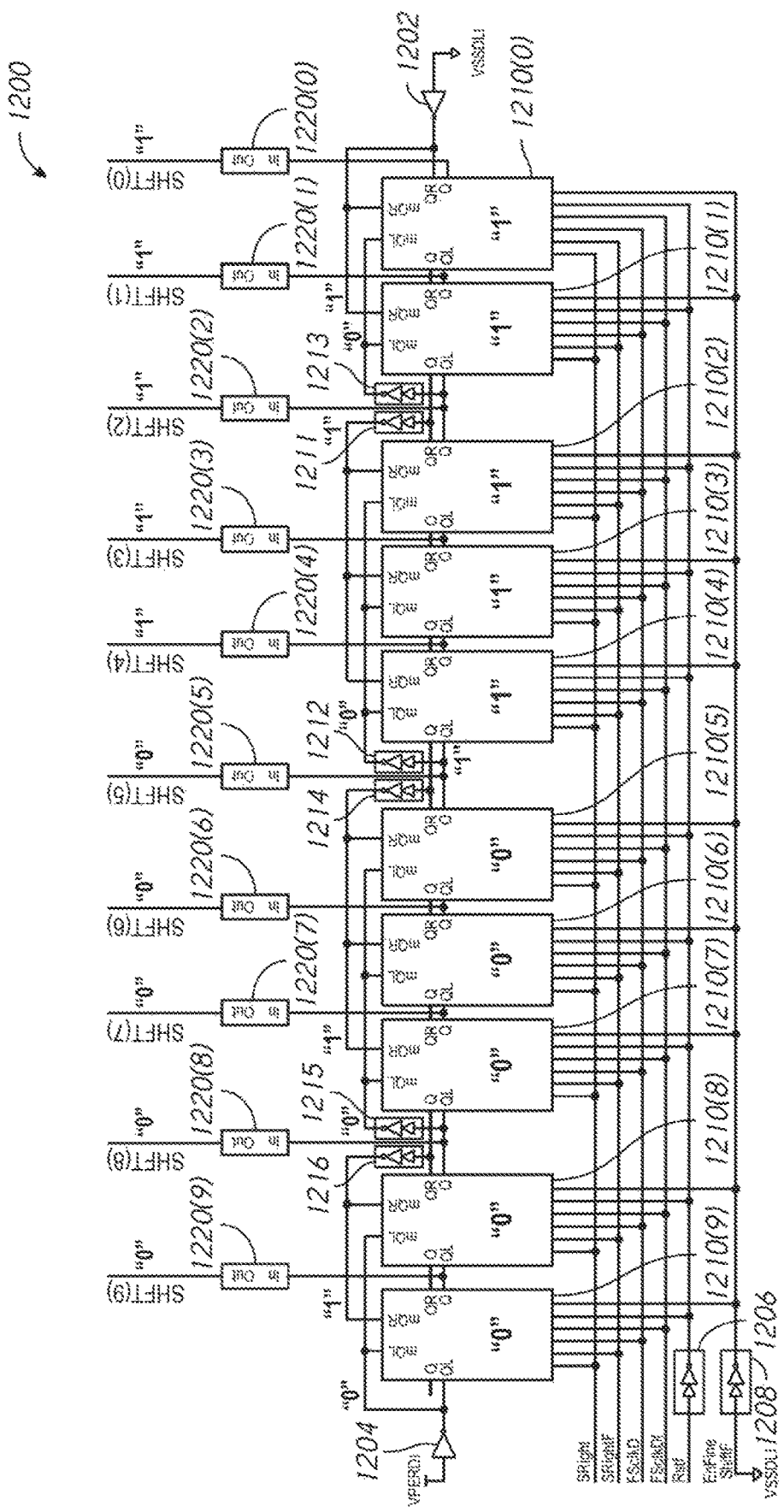
FIGS. 13A-13G illustrate various examples of operation for a shift register circuit according to various embodiments of the disclosure.

FIG. 13A shows a condition of the shift register circuit 1200 following a reset by an active RstF signal. The RstF signal is strobed to a low logic level which causes the shift registers 1210(0)-1210(9) to reset to a known data value. When the RstF signal returns to a high logic level, initial data values are stored by the shift registers 1210(0)-1210(9) as shown in FIG. 13A. For example, the shift registers 1210(0)-1210(4) are reset and store high logic data value (e.g., "1") (e.g., shift registers 1210(0)-1210(4) include a shift stage configured as a set type flip flop), and the shift registers 1210(5)-1210(9) are reset and store low logic data value (e.g., "0") (e.g., shift registers 1210(5)-1210(9) include a shift stage configured as a reset type flip flop).

Thus, as shown by FIG. 13A, following reset of the shift register circuit 1200 by an active RstF signal, the shift registers 1210(0)-1210(4) are set to a "1" and the shift registers 1210(5)-1210(9) are set of a "0". The corresponding SHFT signal provided by the registers 1220(0)-1220(9) includes SHFT(0)-SHFT(4) as "1" and SHFT(5)-SHFT(9) as "0".

In embodiments of the disclosure where the SHFT(0)-SHFT(9) signals are provided to a phase mixer circuit (e.g., phase mixer circuit 510 of FIG. 5), following reset of the shift register circuit 1200, clocks provided to the phase mixer circuit (e.g., O clock and E clock) are equally weighted and the resulting DLLR clock has a fine delay of one-half (50%) of the total range of fine delay provided by the phase mixer circuit.

Figure 13B:
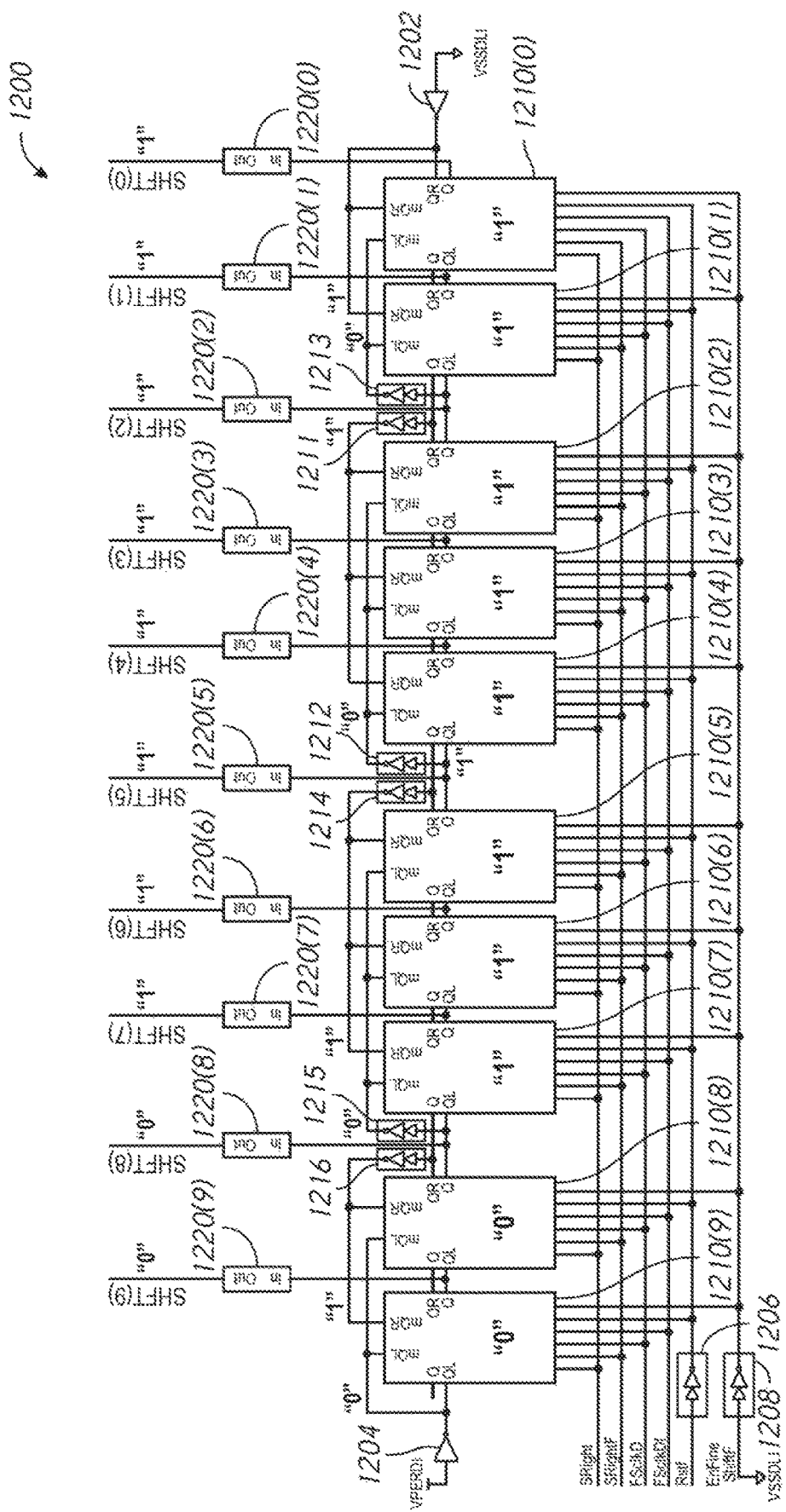

FIG. 13B shows a condition of the shift register circuit 1200 when controlled to shift data to more than one register at a time to the left (e.g., toward the shift register 1210(9)) following the shift registers 1210(0)-1210(4) storing "1" data and the shift registers 1210(5)-1210(9) storing "0" data (e.g., condition shown in FIG. 13A). The EnFineShiftF is at a high logic level, and consequently, data input from the mQR nodes are latched by the shift registers 1210(0)-1210(4) and data input from the mQL nodes are latched by the shift registers 1210(5)-1210(9). The shift registers 1210(5)-1210(7) are controlled by the SRight and SRightF signals to output at the respective Q nodes the data at the mQR nodes. As a result, the "1" data value stored by the shift register 1210(4) and provided through the buffer 1214 to the mQR nodes of the shift registers 1210(5)-1210(7) is latched to set all of the shift registers 1210(5)-1210(7) to store "1" data. The shift registers 1210(8) and 1210(9) continue to store "0" data, however. The "1" data value latched by the shift registers 1210(5)-1210(7) causes the corresponding SHFT(5)-SHFT(7) signals to change to "1", which results in the shift register circuit 1200 providing SHFT(0)-SHFT(7) signals that are "1" and SHFT(8) and SHFT(9) signals that are "0".

In embodiments of the disclosure where the SHFT(0)-SHFT(9) signals are provided to a phase mixer circuit, one of the clocks provided to the phase mixer circuit has approximately ⅘ weight and the other clock has approximately ⅕ weight (e.g., O clock has 80% weight and E clock has 20% weight). The resulting DLLR clock has a timing that is based on a 80% and 20% weighting (e.g., based mostly on the timing of the O clock).

Figure 13C:
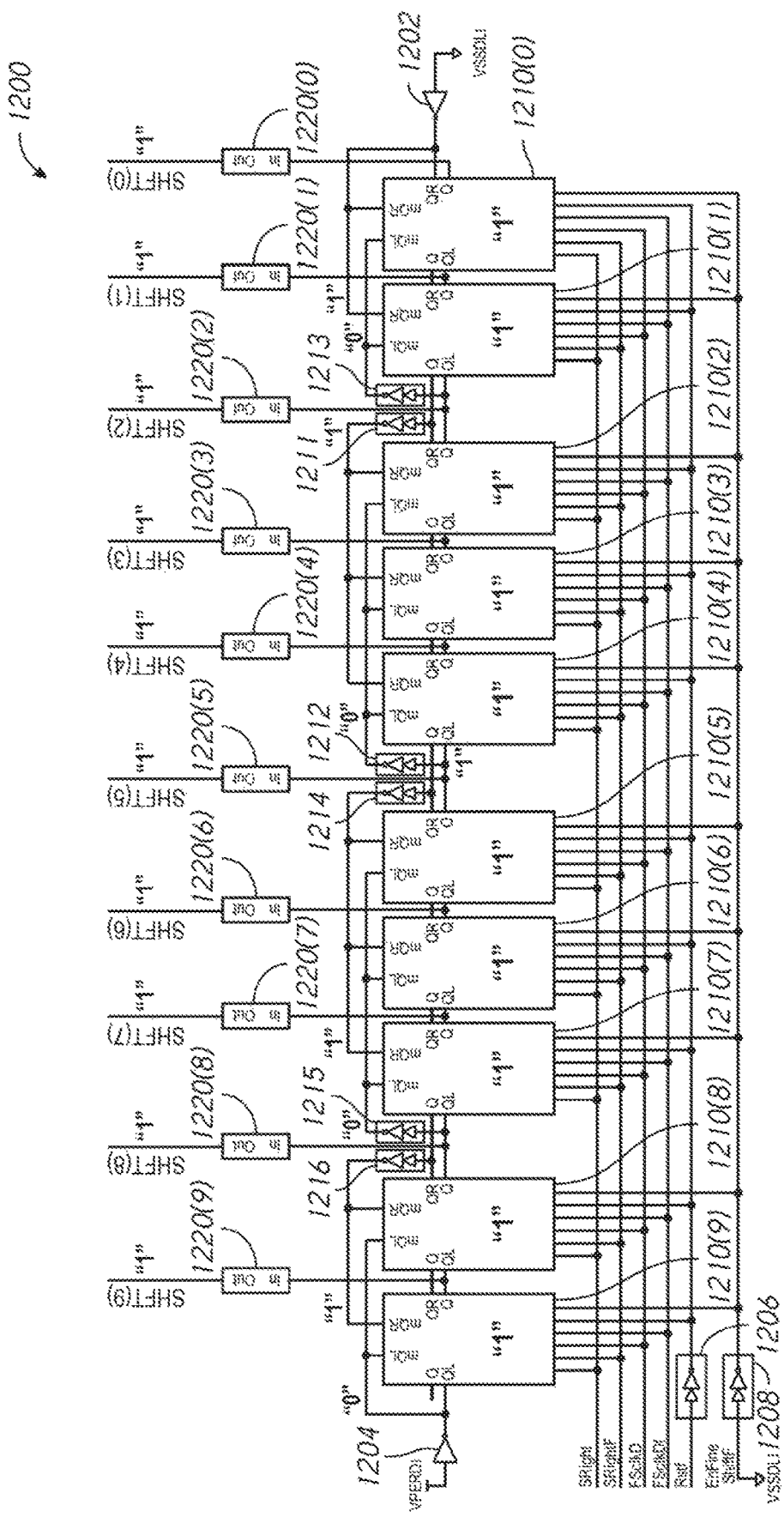

FIG. 13C shows a condition of the shift register circuit 1200 when controlled to shift data to more than one register at a time to the left following the shift registers 1210(0)-1210(7) storing "1" data and the shift registers 1210(8) and 1210(9) storing "0" data (e.g., condition shown in FIG. 13B). The EnFineShiftF is at the high logic level so that the mQR and mQL nodes are input to the shift registers 1210(0)-1210(9). The shift registers 1210(8) and 1210(9) are controlled by the SRight and SRightF signals to output at the respective Q nodes the data at the mQR nodes. As a result, the "1" data value stored by the shift register 1210(7) and provided through the buffer 1216 to the mQR nodes of the shift registers 1210(8) and 1210(9) is latched to set the shift registers 1210(8) and 1210(9) to store "1" data. The "1" data value latched by the shift registers 1210(8) and 1210(9) causes the corresponding SHFT(8) and SHFT(9) signals to change to "1", which results in the shift register circuit 1200 providing SHFT(0)-SHFT(9) signals that are all "1".

In embodiments of the disclosure where the SHFT(0)-SHFT(9) signals are provided to a phase mixer circuit, one of the clocks provided to the phase mixer circuit has full weight and the other clock has no weight (e.g., O clock has full weight (100%) and E clock has no weight (0%)), and the resulting DLLR clock has a timing that is based on the fully weighted clock (e.g., based on the timing of the O clock and not the E clock).

Figure 13D:
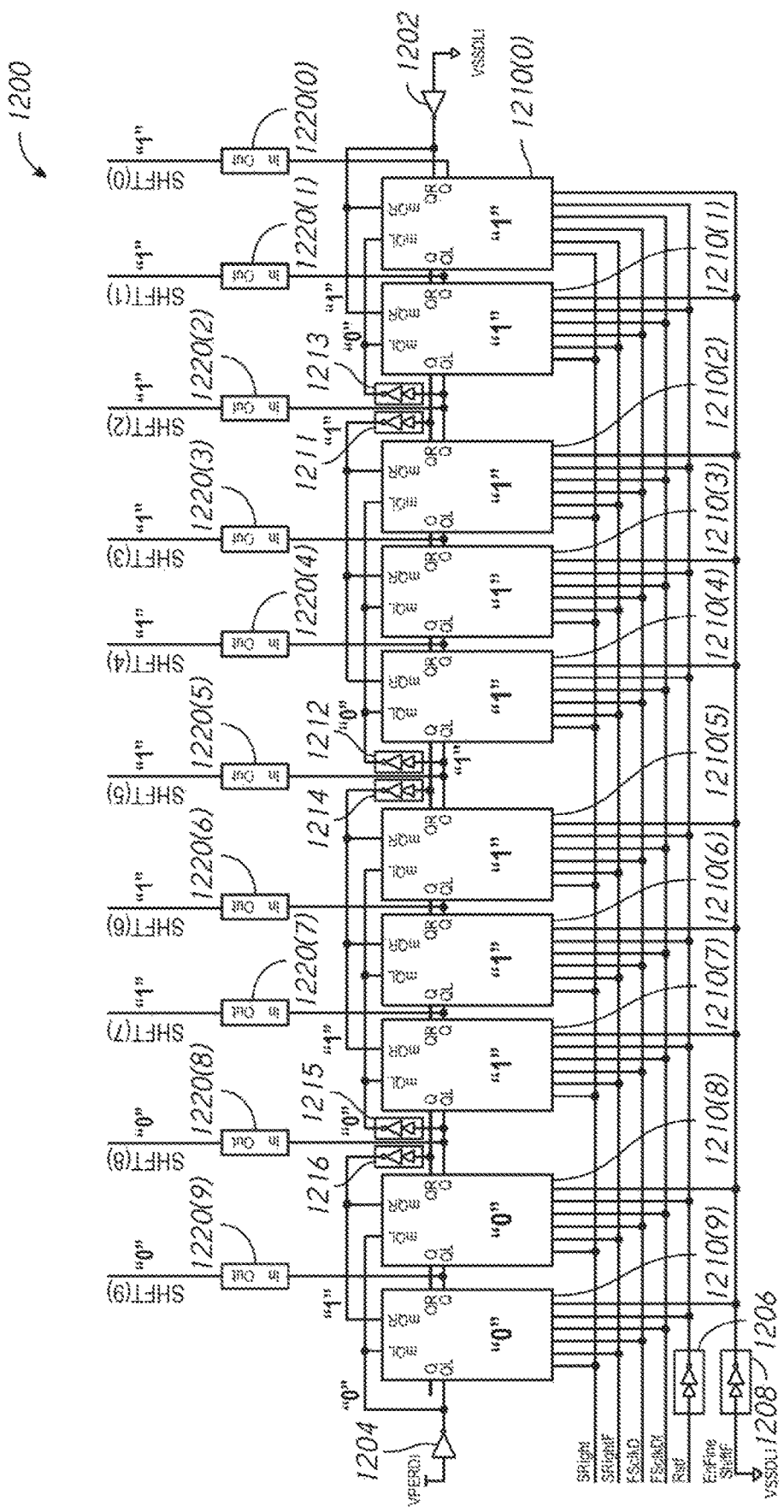

FIG. 13D shows a condition of the shift register circuit 1200 when controlled to shift data to more than one register at a time to the right (e.g., toward the shift register 1210(0)) following all of the shift registers 120(0)-1210(9) storing "1" data (e.g., condition shown in FIG. 13C). The EnFineShiftF is at the high logic level so that the mQR and mQL nodes are input to the shift registers 1210(0)-1210(9). The shift registers 1210(8) and 1210(9) are controlled by the SRight and SRightF signals to output at the respective Q nodes the data at the mQL nodes. As a result, the "0" data value provided by the inverter 1204 and provided to the mQL nodes of the shift registers 1210(8) and 1210(9) is latched to set the shift registers 1210(8) and 1210(9) to store "0" data. The "0" data value latched by the shift registers 1210(8) and 1210(9) causes the corresponding SHFT(8) and SHFT(9) signals to change to "0", which results in the shift register circuit 1200 providing SHFT(0)-SHFT(7) as "1" and SHFT(8) and SHFT(9) as "0".

As previously described, in embodiments of the disclosure where the SHFT(0)-SHFT(9) signals are provided to a phase mixer circuit, one of the clocks provided to the phase mixer circuit has approximately ⅘ weight and the other clock has approximately ⅕ weight (e.g., O clock has 80% weight and E clock has 20% weight. The resulting DLLR clock has a timing that is based on a 80% and 20% weighting (e.g., based mostly on the timing of the O clock).

Figure 13E:
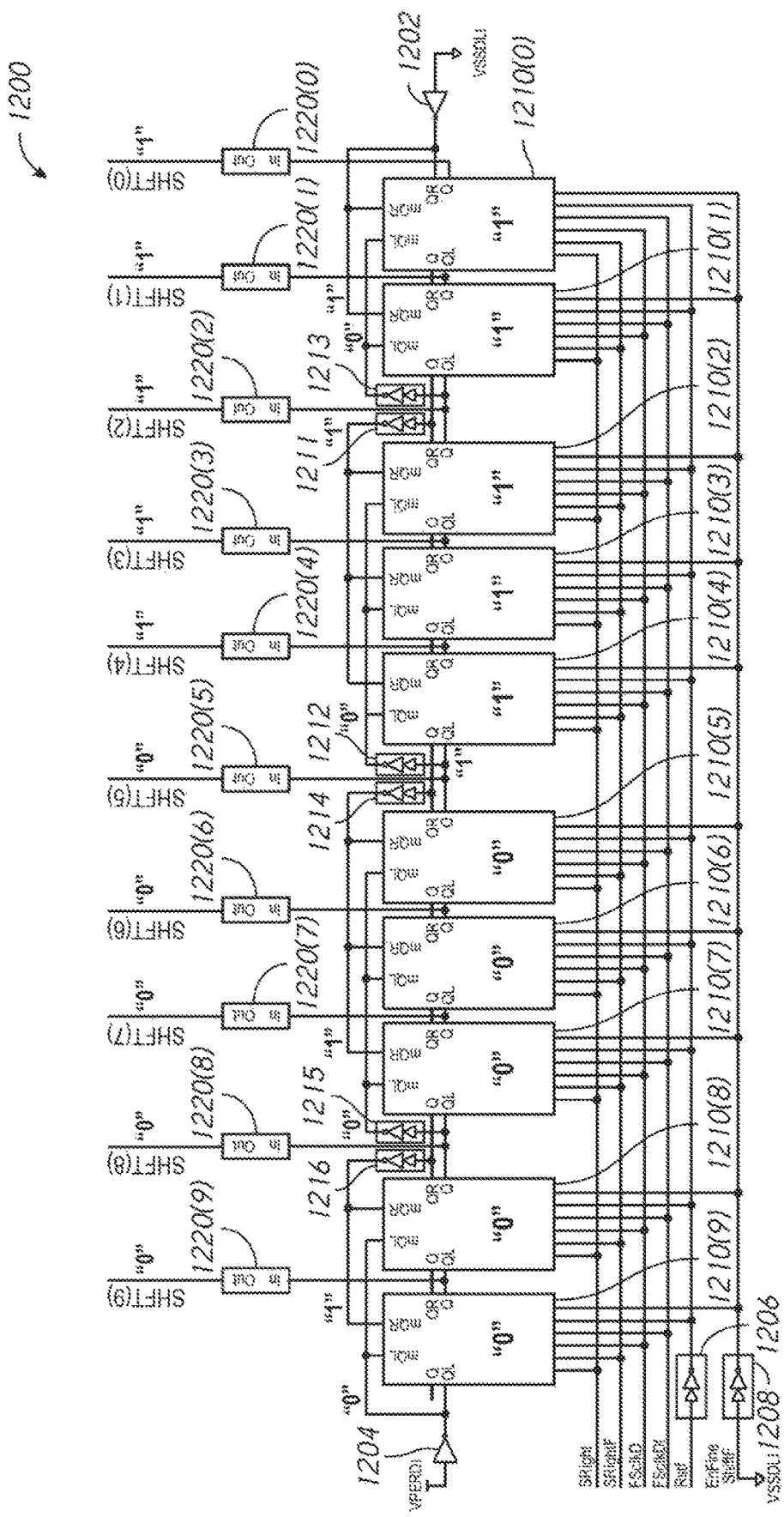

FIG. 13E shows a condition of the shift register circuit 1200 when controlled to shift data to more than one register at a time to the right following the shift registers 1210(0)-1210(7) storing "1" data and the shift registers 1210(8) and 1210(9) storing "0" data (e.g., conditions shown in FIGS. 13B and 13D). The EnFineShiftF is at the high logic level so that the mQR and mQL nodes are input to the shift registers 1210(0)-1210(9). The shift registers 1210(5)-1210(7) are controlled by the SRight and SRightF signals to output at the respective Q nodes the data at the mQL nodes. As a result, the "0" data value stored by the shift register 1210(8) and provided through the buffer 1215 to the mQL nodes of the shift registers 1210(5)-1210(7) is latched to set the shift registers 1210(5)-1210(7) to store "0" data. The "0" data value latched by the shift registers 1210(5)-1210(7) causes the corresponding SHFT(5)-SHFT(7) signals to change to "0", which results in the shift register circuit 1200 providing SHFT(0)-SHFT(4) as "1" and SHFT(5)-SHFT(9) as "0".

As previously described, in embodiments of the disclosure where the SHFT(0)-SHFT(9) signals are provided to a phase mixer circuit, providing a SHFT signal including SHFT(0)-SHFT(9) signals having half "1" and the other half "0" causes the phase mixer circuit to equally weight the input clocks (e.g., O clock and E clock), resulting in a DLLR clock having a fine delay of one-half (50%) of the total range of fine delay provided by the phase mixer circuit.

Figure 13F:
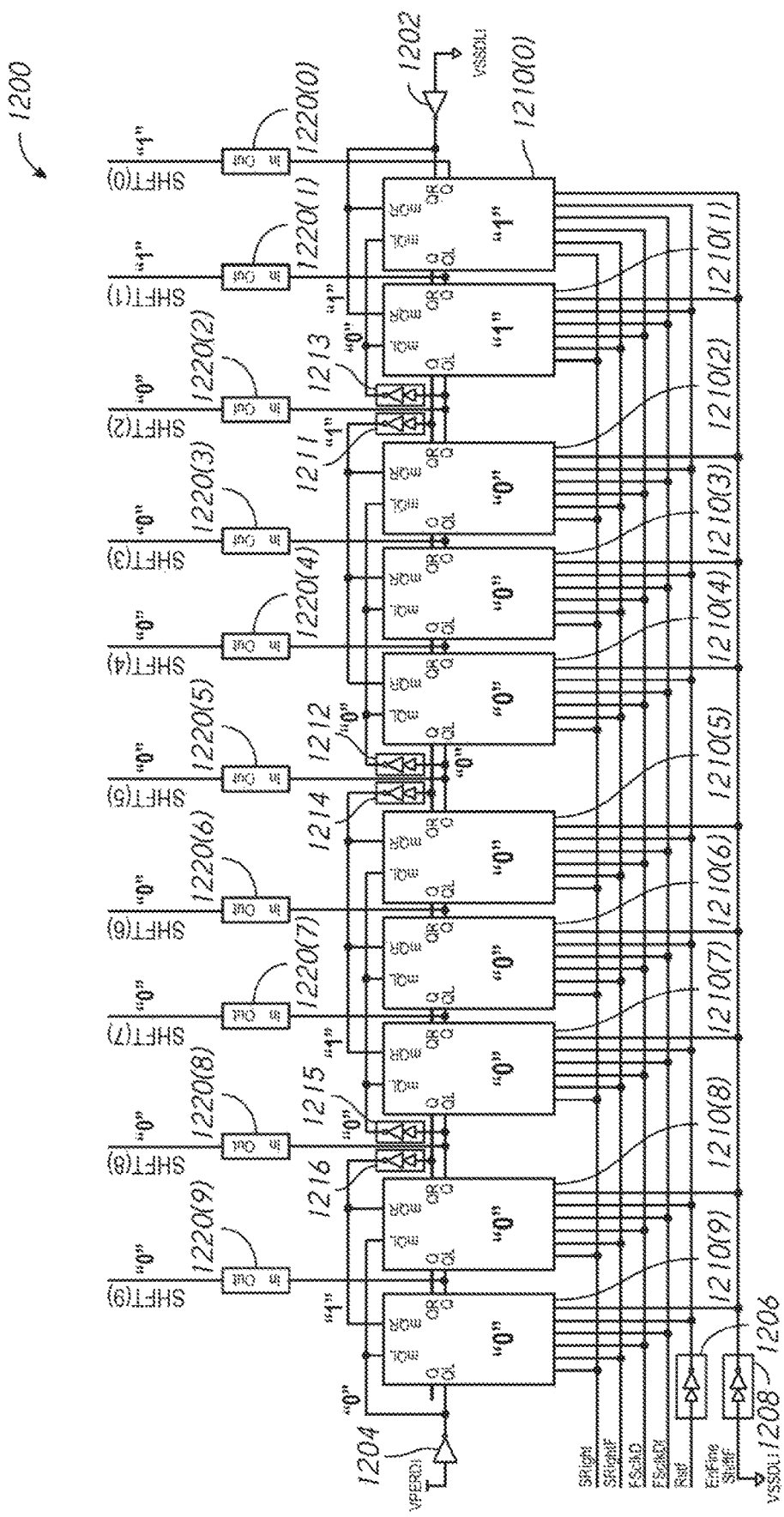

FIG. 13F shows a condition of the shift register circuit 1200 when controlled to shift data to more than one register at a time to the right (e.g., toward the shift register 1210(0)) following the shift registers 1210(0)-1210(4) storing "1" data and the shift registers 1210(5)-1210(9) storing "0" data (e.g., conditions shown in FIGS. 13A and 13E). The EnFineShiftF is at the high logic level so that the mQR and mQL nodes are input to the shift registers 1210(0)-1210(9). The shift registers 1210(2)-1210(4) are controlled by the SRight and SRightF signals to output at the respective Q nodes the data at the mQL nodes. As a result, the "0" data value stored by the shift register 1210(5) and provided through the buffer 1212 to the mQL nodes of the shift registers 1210(2)-1210(4) is latched to set the shift registers 1210(2)-1210(4) to store "0" data. The "0" data value latched by the shift registers 1210(2)-1210(4) causes the corresponding SHFT(2)-SHFT(4) signals to change to "0", which results in the shift register circuit 1200 providing SHFT(0) and SHFT(1) as "1" and SHFT(2)-SHFT(9) as "0".

In embodiments of the disclosure where the SHFT(0)-SHFT(9) signals are provided to a phase mixer circuit, one of the clocks provided to the phase mixer circuit has approximately ⅕ weight and the other clock has approximately ⅘ weight (e.g., O clock has 20% weight and E clock has 80% weight. The resulting DLLR clock has a timing that is based on a 20% and 80% weighting (e.g., based mostly on the timing of the E clock).

Figure 13G:
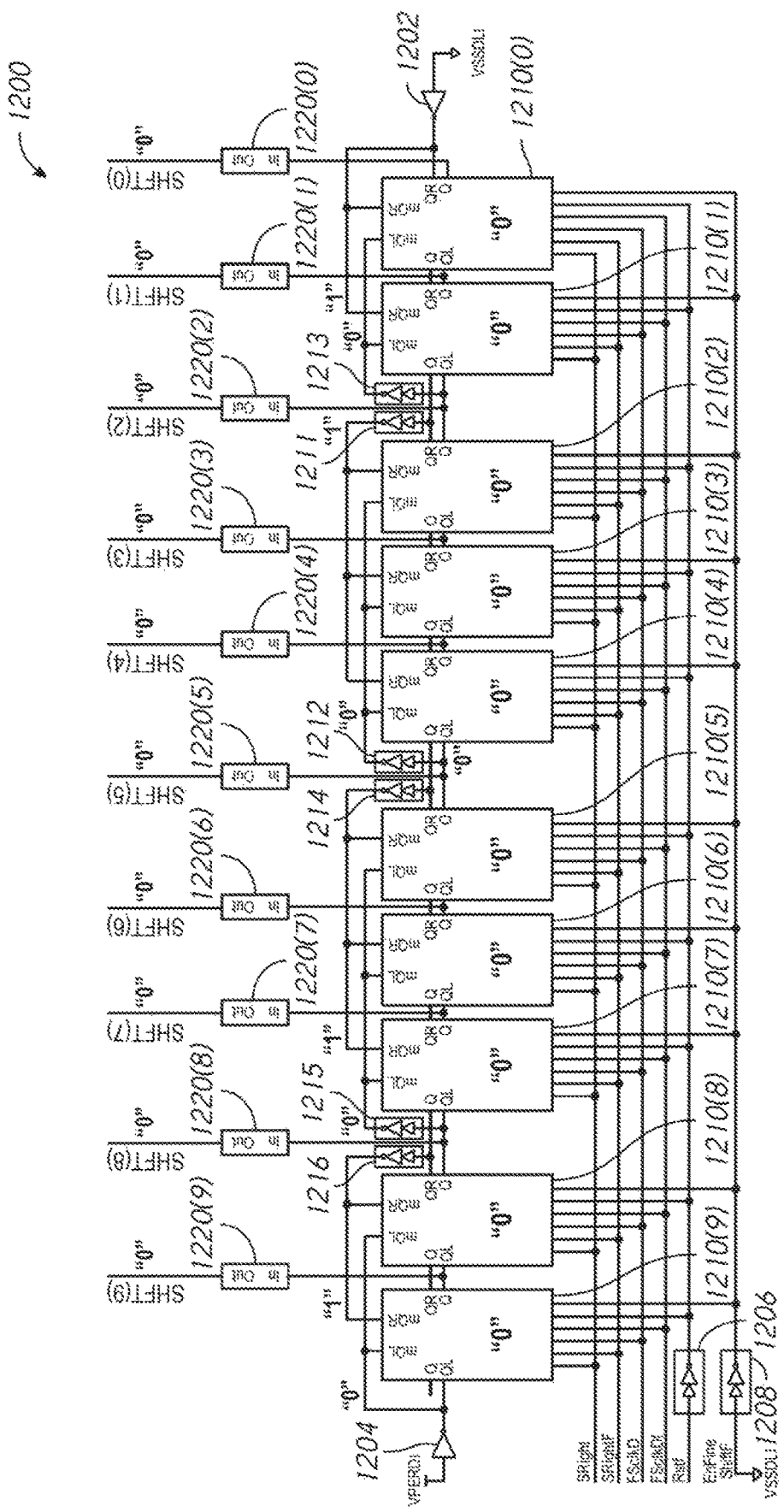

FIG. 13G shows a condition of the shift register circuit 1200 when controlled to shift data to more than one register at a time to the right following the shift registers 1210(0) and 1210(1) storing "1" data and the shift registers 1210(2)-1210(9) storing "0" data (e.g., conditions shown in FIG. 13F). The EnFineShiftF is at the high logic level so that the mQR and mQL nodes are input to the shift registers 1210(0)-1210(9). The shift registers 1210(0) and 1210(1) are controlled by the SRight and SRightF signals to output at the respective Q nodes the data at the mQL nodes. As a result, the "0" data value stored by the shift register 1210(2) and provided through the buffer 1213 to the mQL nodes of the shift registers 1210(0) and 1210(1) is latched to set the shift registers 1210(0) and 1210(1) to store "0" data. The "0" data value latched by the shift registers 1210(0) and 1210(1) causes the corresponding SHFT(0) and SHFT(1) signals to change to "0", which results in the shift register circuit 1200 providing SHFT(0)-SHFT(9) signals that are all "0".

In embodiments of the disclosure where the SHFT(0)-SHFT(9) signals are provided to a phase mixer circuit, one of the clocks provided to the phase mixer circuit has no weight and the other clock has full weight (e.g., O clock has no weight (0%) and E clock has full weight (100%)), and the resulting DLLR clock has a timing that is based on the fully weighted clock (e.g., based on the timing of the E clock and not the O clock).

As illustrated by the examples of FIGS. 13A-13G, the shift register circuit 1200 may be controlled to shift data to more than one register at a time to the left or to the right. The data values are changed by a group of shift registers. In the particular examples, data is shifted to groups of the shift registers 1210(0)-1210(9) at a time. As previously described, the shift register stages 1210(0)-1210(9) are divided into four groups of shift registers to provide shifting of data to the left or right to four different groups of shift registers: (1) shift registers 1210(0) and 1210(1); (2) shift registers 1210(2)-1210(4); (3) shift registers 1210(5)-1210(7); and (4) shift registers 1210(8) and 1210(9). In this manner, a fine delay provided by a fine phase adjust circuit may be quickly adjusted to provide one of five different fine delays, rather than being incrementally adjusted by one shift register 1210 at a time. In the example of shift register circuit 1200, the fine delay may be quickly adjusted between (1) 50% weight for first and second clocks; (2) 80% and 20% for the first and second clocks; (3) 100% for the first clock and 0% for the second clock; (4) 20% and 80% for the first and second clocks; and (5) 0% for the first clock and 100% for the second clock. Quickly adjusting a fine delay by non-sequential steps of fine delay may provide faster locking of a clock generator circuit during initialization compared to incremental fine delay adjustment. The shift register circuit 1200 has the additional feature of facilitating quick adjustment of the fine delay with greater precision compared to the shift register circuit 800.

As previously described, the shift register circuit 1200 may also be controlled also shift data to one register at a time to the left (e.g., toward shift register 1210(9)) or to the right (e.g., toward shift register 1210(0)). The data values are changed by individual shift registers. The EnFineShiftF signal is a low logic level to control the shift register circuit 1200 to operate in this manner. Operation of the shift register circuit 1200 to shift data one register at a time to the left or right is similar to operation as previously described with reference to FIG. 11.

The shift register circuit 1200, which has 10 shift registers to provide 10 individual control signals, shifting the data by one shift register at a time to the left or right causes a change in the fine delay in increments of 10% of the total range of fine delay. That is, the delay may be adjusted by a minimum delay of 10% of the total range of fine delay. By providing a shift register circuit that can shift data one shift register at a time (e.g., previously described with reference to FIG. 11), and also shift data to more than one register at a time (e.g., previously described with reference to FIGS. 13A-13G), the fine delay provided by the fine phase adjust circuit may be adjusted incrementally, such as during normal operation following initialization, as well as being adjusted quickly, such as during initialization of a clock generator circuit.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:
1. An apparatus, comprising:
a shift register,
the shift register comprising a plurality of registers coupled in series to one another,
the plurality of registers being grouped into a first group of registers and a second group of registers, the first group of registers comprising first and second registers, the second group of registers comprising a third register, the first and second registers of the first group of registers being configured to receive in common an output of the third register of the second group of registers so that both the first and second registers store the output of the third register responsive to a shift clock.

2. The apparatus of claim 1, wherein each of the plurality of registers is configured to receive an enable signal which enables the first and second registers to store the value of the third register of the second group of the registers when the enable signal is enabled.

3. The apparatus of claim 2, wherein the second group of the registers is configured in common to receive an output of a fourth register of the first group of the registers so that the second group of the registers stores a value of the output of the fourth register responsive to a shift clock.

4. The apparatus of claim 3, wherein each of the plurality of registers is configured to receive a control signal which enables to control whether the first group of the register stores the value or the second group of the registers stores the value.

5. The apparatus of claim 4, wherein each of the plurality of registers is configured to receive a reset signal which sets an initial value into each of the plurality of the registers.

6. The apparatus of claim 5, wherein, when the enable signal is disabled, only one register in the first group of the registers is configured to store the value of the output of the third register responsive to the shift clock.

7. An apparatus, comprising:
a phase mixer circuit configured to receive first and second clocks and provide an output clock based on the first and second clocks, wherein the first and second clocks have a phase difference relative to one another; and
a shift register configured to provide control signals to the phase mixer circuit to adjust a delay of the output clock, the shift register including a plurality of registers coupled in series, each register of the plurality of registers configured to receive a shift clock and further configured to store a respective data value and provide a respective one of the control signals based on the respective value stored, the shift register configured in a first mode to change the respective data values stored by the plurality of registers by more than one register at a time responsive to the shift clock and configured in a second mode to change the respective values stored for the plurality of registers one register at a time responsive to the shift clock.

8. The apparatus of claim 7 wherein the plurality of shift registers comprises:
a first group of shift registers and a second group of shift registers,
wherein the first group of shift registers configured to commonly receive the respective data value from a shift register of the second group of shift registers, and
wherein the second group of shift registers configured to commonly receive the respective data value of a shift register of the first group of shift registers.

9. The apparatus of claim 8 wherein the plurality of shift registers further comprises:
a third group of shift registers,
wherein the third group of shift registers is configured to commonly receive the respective data value from a second shift register of the second group of shift registers, and
wherein the second group of shift registers configured to commonly receive the respective data value of a shift register of the third group of shift registers.

10. The apparatus of claim 8 wherein a second shift register of the first group of shift registers is configured to receive the respective data value from the shift register of the first group of shift registers and further configured to provide the respective data value of the second shift register of the first group of shift registers to the shift register of the first group of shift registers.

11. The apparatus of claim 7 wherein the phase mixer circuit comprises:
a first driver circuit configured to provide the first clock to an output node with a drive strength based on the control signals from the shift register; and
a second driver circuit configured to provide the second clock to the output node with a drive strength based on the control signals from the shift register.

12. The apparatus of claim 7 wherein register of the plurality of registers comprises:
a shift stage configured to receive the shift clock and configured to shift a data value at an input ode to an output node responsive to the shift clock;
a first multiplexer circuit configured to receive data values are first, second, and third data value nodes and provide the data values from the first and third data value nodes or from the second and fourth data value nodes responsive to a first multiplexer control signal; and
a second multiplexer circuit configured to receive the data values provided by the first multiplexer and provide to the input node of the shift stage one of the data values provided by the first multiplexer responsive to a second multiplexer control signal.

13. A method, comprising:
adjusting a delay of a phase mixer circuit by minimum delay adjustments during normal operation of the phase mixer circuit; and
adjusting the delay of the phase mixer circuit by greater than the minimum delay adjustments during initialization of the phase mixer circuit, wherein adjusting the delay of the phase mixer circuit greater than the minimum delay adjustments is provided by a plurality of series coupled shift registers.

14. The method of claim 13 wherein adjusting a delay of the phase mixer circuit by the minimum delay adjustments comprises activating or deactivating one signal driver circuit included in the phase mixer circuit.

15. The method of claim 13 wherein adjusting a delay of the phase mixer circuit by greater than the minimum delay adjustments comprises activating or deactivating at a same time a plurality of signal driver circuits included in the phase mixer circuit.

16. The method of claim 13 wherein adjusting the delay of the phase mixer circuit by the minimum delay adjustment comprises changing data values one shift register at a time for a plurality of series coupled shift registers, and wherein adjusting the delay of the phase mixer circuit by greater than the minimum delay adjustments comprises changing data values of groups of shift registers for the plurality of series coupled shift registers.

17. A method, comprising:
changing data values stored by a plurality of shift registers,
wherein the data values are changed by groups of shift registers of the plurality of shift registers during a first mode of operation, and
wherein the data values are changed by individual shift registers of the plurality of shift registers during a second mode of operation.

18. The method of claim 17 wherein a first group of shift registers of the plurality of shift registers includes half of the plurality of shift registers and a second group of shift registers of the plurality of shift registers includes an other half of the plurality of shift registers.

19. The method of claim 17 wherein the plurality of shift registers are coupled in series and wherein the data values are changed by individual shift registers by changing the data value of an adjacent shift register of the plurality of shift registers.

20. The method of claim 17, further comprising setting a first group of shift registers of the plurality of shift registers to a first data value and setting a second group of shift registers of the plurality of shift registers to a second data value that is different than the first data value.

* * * * *